US008440908B2

(12) United States Patent
Triani et al.

(10) Patent No.: US 8,440,908 B2
(45) Date of Patent: May 14, 2013

(54) SOLAR CELL AND METHOD FOR PREPARATION THEREOF

(75) Inventors: Gerardo Triani, Oatley (AU); Jonathan Andrew Campbell, Maroubra (AU); Graeme Moad, Sassafras (AU); Gavin Errol Collis, Melbourne (AU); Peter John Evans, Jannali (AU); Robert Paul Burford, Zetland (AU); Attila Janos Mozer, Figtree (AU)

(73) Assignee: Polymers CRC Ltd., Notting Hill, Victoria (AU)

( * ) Notice: Subject to any disclaimer, the term of this patent is extended or adjusted under 35 U.S.C. 154(b) by 505 days.

(21) Appl. No.: 12/669,799

(22) PCT Filed: Jul. 22, 2008

(86) PCT No.: PCT/EP2008/059575
§ 371 (c)(1),
(2), (4) Date: Apr. 22, 2010

(87) PCT Pub. No.: WO2009/013285
PCT Pub. Date: Jan. 29, 2009

(65) Prior Publication Data
US 2010/0200051 A1    Aug. 12, 2010

Related U.S. Application Data

(60) Provisional application No. 60/935,065, filed on Jul. 25, 2007.

(51) Int. Cl.
*H01G 9/20* (2006.01)
*H01L 21/314* (2006.01)

(52) U.S. Cl.
USPC ......................................................... 136/256

(58) Field of Classification Search .................... 136/256
See application file for complete search history.

(56) References Cited

U.S. PATENT DOCUMENTS

| | | | |
|---|---|---|---|
| 4,927,721 A | 5/1990 | Gratzel et al. | |
| 5,084,365 A | 1/1992 | Gratzel et al. | |
| 5,350,644 A | 9/1994 | Graetzel et al. | |
| 5,441,827 A | 8/1995 | Gratzel et al. | |
| 5,525,440 A | 6/1996 | Kay et al. | |
| 2009/0000660 A1 | 1/2009 | Pellin et al. | |

FOREIGN PATENT DOCUMENTS

| | | |
|---|---|---|
| WO | 2009/040499 A1 | 4/2009 |
| WO | 2009/156321 A1 | 12/2009 |

OTHER PUBLICATIONS

Martinson et alo "ZnO Nanotube Based Dye-Sensitized Solar Cells," Nano Letters, 2007, vol. 7, No. 8, pp. 2183-2187.*
Baker et al., BERR—Power on Plastic—A Feasibility Study for the Volume Manufacture of Dye-Sensitised Solar Cells on Flexible Substrates—contract No. S/P2/00474/REP-URN No. 07/1655 (Nov. 2007).
J. Baker Conference Proceedings, 8th International Conference on Atomic Layer Deposition, Bruges, Belgium Jun. 29-Jul. 2, 2008.
J. Baker Conference Proceedings, 8th International Conference on Atomic Layer Deposition, Bruges, Belgium Jun. 29-Jul. 2, 2008 (Abstract).
Law et al., "ZnO-Al2O3 and ZnO-TiO2 Core-Shell Nanowire Dye-Sensitized Solar Cells," J. Phys. Chem. B. 110 (45):22652-22663 (2006).
Kroon et al., "Nanocrystalline Dye-Sensitized Solar Cells Having Maximum Performance," Prog. Photovoltaics: Res. Appl. 15(1):1-18 (online publication Jun. 21, 2006).
Roh et al., "Achievement of 4.51% Conversion Efficiency Using ZnO Recombination Barrier Layer in TiO(2) Based Dye-Sensitized Solar Cells," Appl. Phys. Lett. 89:253512 (2006).
Taguchi et al., "Improving the Performance of Solid-State Dye-Sensitized Solar Cell Using MgO-Coated TiO2 Nanoporous Film," Chem. Commun. (Camb.) 7(19):2480-2481 (2003).
Menzies et al., "Modification of Mesoporous TiO(2) Electrodes by Surface Treatment with Titanium (IV), Indium (III) and Zirconium (IV) Oxide Precursors: Preparation, Characterization and Photovoltaic Performance in Dye-Sensitized Nanocrystalline Solar Cells," Nanotechnol. 18:125608 (2007).
Lee et al., "Modification of Electrodes in Nanocrystalline Dye-Sensitized TiO(2) Solar Cells," Solar Energy Mat. Solar Cell 65(1-4):193-200 (2001).
Zhang et al., "Slow Interfacial Charge Recombination in Solid-State Dye-Sensitized Solar Cell Using Al(2)O(3)—Coated Nanoporous TiO(2) Films," Solar Energy Mat. Solar Cell 81(2):197-203 (2004).
Menzies et al., "Characterization of Nanostructured Core-Shell Working Electrode Application in Dye-Sensitized Solar Cells," Surface and Coating Technol. 198(1-3):118-122 (2005).
Leskela et al., "Atomic Layer Deposition (ALD): From Precursors to Thin Film Structures," Thin Solid Films 409 (1):138-146 (2002).

* cited by examiner

*Primary Examiner* — Nathan M Nutter
(74) *Attorney, Agent, or Firm* — LeClairRyan, a Professional Corporation (57) ABSTRACT

The present invention relates to a dye sensitized solar cell comprising a semiconductor formed of a particulate metal oxide, a dye adsorbed onto the semiconductor wherein the semiconductor interface with the dye is formed by atomic layer deposition (ALD) of a semiconductor material onto the particulate metal oxide.

23 Claims, 3 Drawing Sheets

SOLAR CELL AND METHOD FOR PREPARATION THEREOF

The present invention relates to photovoltaic devices and more particularly to dye sensitized solar cells and to a method of preparation thereof. More particularly, the present invention relates to a dye sensitized solar cell comprising a semiconductor formed of a particulate metal oxide, a dye adsorbed onto the semiconductor wherein the semiconductor interface with the dye is formed by atomic layer deposition (ALD) of a semiconductor material onto the particulate metal oxide.

BACKGROUND

A dye sensitized solar cell (DSSC) is a photovoltaic system which uses a semiconductor formed of a nanoparticulate or nanoporous metal oxide to provide a high surface area structure, a dye (typically comprising an organic or metal complex component) adsorbed onto the semiconductor to produce excited electrons from absorbed light and an electrolyte in contact with both the dye and the counter electrode. The electrodes of a DSSC include an optical electrode generally in the form of a transparent conducting oxide (TCO) which is supported on a light transmissible substrate and a counter electrode separated from the anode by the electrolyte, semiconductor and dye.

U.S. Pat. No. 4,927,721 and U.S. Pat. No. 5,084,365 disclose one of the first practical DSSCs (referred to as the Grätzel cell). It contained a liquid electrolyte and ruthenium dye-coated sintered titanium dioxide. The energy conversion efficiency (ECE) of this type of DSSC has been reported to be as high as 10.4% although variation in performance and reproducibility mean that typically much lower ECEs of ca 5% are reliably obtained. The manufacture of DSSCs typically requires a high temperature sintering process that has limited the substrate to rigid light transmissible materials such as glass.

The Grätzel DSSC contains electrolyte in the form of a solution containing corrosive iodine in an organic solvent and raises problems of leakage and long term operational stability. The use of gel/polymer electrolytes, molten salts, hole transport materials or plastic crystals have been proposed as potential alternatives. Ionic liquids that contain the iodide/triiodide redox are viscous liquids and thus reduce the potential for leakage problems. Grätzel et al in Adv. Mater. 19, 1133-1137, (2007) have shown that ionic liquids in DSSC have high cell performance and good stability properties. In recent years, there has been an interest to find alternatives to liquid electrolytes, which contain the iodide/triodide redox system, that has seen the development of organic charger carrier materials, referred to as hole transport materials. For example, solid state DSSC devices that contain doped hole transport materials, such as SpiroMeOTAD (2,2',7,7'-tetrakis-(N,N-di-p-methoxyphenylamine)-9,9'-spirobifluorene), have been shown to produce moderate efficiencies by Grätzel et al in Adv. Mater. 17, 813-815 (2005).

Kroon (J. M. Kroon et al, Prog. Photovolt. Res. Appl. 15, 1-18 (2007)) describes the use of blocking layers to improve the performance of DSSC by retarding the electron recombination at the electrode interface. In addition, Law (Law et al, J. Phys. Chem. B. 110, 22652-22663 (2006)) has shown that coating the photoanode by means of high temperature (300° C. for $TiCl_4$) ALD enhanced the efficiency of ZnO nanowire DSSCs.

The present invention can provide a DSSC with improved properties. Said properties include one or more of the following: efficiency, short circuit current, open circuit voltage, fill factor, stability, improved dye takeup, and ease of fabrication. Said properties being with reference to a similar DSSC prepared under similar conditions but without said ALD layer efficiency.

The discussion of documents, acts, materials, devices, articles and the like is included in this specification solely for the purpose of providing a context for the present invention. It is not suggested or represented that any or all of these matters formed part of the prior art base or are common general knowledge in the field relevant to the present invention as it existed before the priority date of each claim of this application.

SUMMARY

Accordingly the invention provides a dye sensitized solar cell comprising a semiconductor formed of a particulate metal oxide (e.g. a layer), a dye adsorbed onto the semiconductor wherein the semiconductor interface with the dye is formed by atomic layer deposition of a semiconductor material onto the particulate metal oxide. The metal of the particulate metal oxide is for instance selected from the group consisting of metals of Groups IB, IIA, IIIA, IIIB, IVA, IVB, VA, VB, VIA, VIB and VIII. Preferably, the metal is selected from the group consisting of Mg, Ca, Sr, Ba, Sc, Y, La, Ti, Hf, V, Nb, Ta, Cr, Mo, W, Fe, Ni, Cu, In, Al and Ga. The preferred metal oxide comprises one or more of, for example, titanium oxide, niobium oxide, tungsten oxide, indium oxide, iron oxide, tin oxide, nickel oxide, and strontium titanate, most preferably titanium oxide, niobium oxide, tungsten oxide, indium oxide, tin oxide, nickel oxide, and the like, but is not necessarily limited thereto. These metal oxides may be used alone or in a mixture of two or more. Specific examples of the metal oxide include $TiO_2$, $SnO_2$, $WO_3$, $Fe_2O_3$, $Nb_2O_5$, NiO and $SrTiO_3$, in particular $TiO_2$, $SnO_2$, $WO_3$, $Nb_2O_5$, NiO and $SrTiO_3$, especially $TiO_2$ and $SnO_2$.

We have found that a semiconductor formed of combination a layer of nanoparticles of metal oxide deposited on the optical electrode and an ALD coating of semiconductor material on the nanoparticles provides a significant improvement in cell efficiency.

Accordingly one embodiment of the invention provides a dye sensitized solar cell comprising: a transparent substrate having an internal face, an optical electrode (preferably formed of a transparent conducting oxide (TCO) disposed on the internal face) and a semiconductor in contact with the optical electrode comprising a plurality of layers including (i) a layer of metal oxide nanoparticles, (ii) an ALD coating layer of a semiconductor material deposited on the metal oxide nanoparticles for providing an interface with a dye. The semiconductor interface with the dye is preferably formed by atomic layer deposition (ALD) onto the layer of particulate metal oxide of a semiconductor material selected from the group consisting of titanium oxide, niobium oxide, tungsten oxide, indium oxide, tin oxide, nickel oxide, zirconium oxide and zinc oxide.

The layer of nanoparticles of metal oxide may be in direct contact with an optical electrode or a interface between the optical electrode and nanoparticles may be provided by a compact layer of metal oxide semiconductor material.

In a preferred embodiment the DSSC thus further comprises (iii) an additional layer of metal oxide semiconductor material between said layer of metal oxide particles and said optical electrode by a method selected from the group consisting of ALD, spin coating, dip coating and spray coating, still more preferably the additional layer is deposited by ALD. For instance, the DSSC comprises a transparent substrate having an internal face; an optical electrode on the internal face of the substrate; a semiconductor comprising a layer of metal oxide particles; and a dye adsorbed onto the semiconductor wherein layers of semiconductor material formed by atomic layer deposition (ALD) provide an interface between each of the metal oxide particles and optical electrode and the metal oxide particles and the dye. In this embodiment the additional layer of metal oxide semiconductor material between the optical electrode and layer of metal oxide particles is preferably formed by atomic layer deposition (ALD) of a metal oxide selected from the group consisting of titanium oxide, niobium oxide, tungsten oxide, indium oxide, tin oxide, nickel oxide, zirconium oxide and zinc oxide.

The DSSC will typically further comprise a counter electrode and electrolyte that separates the counter electrode from the semiconductor.

The invention in a further embodiment provides a process for forming a DSSC comprising:

(i) forming a layer of metal oxide particles as defined herein;

(ii) applying a semiconductor layer to the particles by a process comprising atomic layer deposition;

(iii) preferably adsorbing a photosensitive dye into the semiconductor layer;

(iiv) preferably providing an electrolyte and counter electrode in operational relationship with said dye.

Preferred is a process further comprising forming an optical electrode on a light transmissible substrate and forming an ALD deposited layer of a metal oxide semiconductor on the optical electrode and forming the particulate layer of metal oxide on said ALD deposited layer.

The process preferably further comprises a preliminary step of providing an optical electrode which is generally in the form of a transparent conducting oxide (TCO) which is supported on a light transmissible substrate.

Furthermore in this process it is preferred to form a compact layer of a metal oxide semiconductor on the optical electrode, for providing an interface of the electrode with the particulate layer of metal oxide; the particulate layer of metal oxide is preferably then formed on said compact layer of metal oxide semiconductor; and an ALD layer is deposited on the particulate layer of metal oxide for providing an interface with the dye.

Accordingly in the second embodiment, the process for preparing a dye sensitized solar cell comprises:

(i) providing an optical electrode being a transparent substrate having on one face thereof preferably a transparent conducting oxide (TCO);

(ii) depositing a compact layer of semiconductor material preferably by a method selected from atomic layer deposition, spin coating, dip coating and spray coating onto said optical electrode;

(iii) applying at least one layer of metal oxide nanoparticles onto said compact layer of semiconductor material as defined herein;

(iv) depositing a coating of semiconductor material by atomic layer deposition on to said at least one layer of metal oxide particles;

(v) contacting the coating of semiconductor material with a dye; and (vi) providing an electrolyte and counter electrode in operational relationship with said dye.

It will be understood by those skilled in the art that the step (iii) of applying the layer of metal oxide nanoparticles will typically involve applying the layer in the form of a colloid paste, providing particle interconnectivity by sintering or some other process and/or removing of volatiles used in applying the colloid layer of metal oxide particles. Another method of applying the layer of metal oxide nanoparticles is flame spray pyrolysis.

The substrate may be a rigid substrate such as glass or a temperature sensitive flexible material such as a plastic. The complete ALD process of the invention is preferably conducted at temperatures of no more than 400° C. and preferably no less than 25° C., more preferably no more than 300° C., for instance at no more than 299° C., especially at less than 299° C., for example at no more than 250° C., such as at no more than 200° C., especially at no more than 150° C., for example at no more than 120° C. The temperature used (in this step and in other steps) may be decided on the basis of the thermal sensitivity of the chosen substrate and the nature of the semiconductor layer to be deposited. For example in the case of polymer based transparent substrates the temperature is preferably below the melting temperature of the polymer and no more than 20° C. above the glass transition temperature. More preferably the temperature is 10° C. below the glass transition temperature. For instance, the glass transition temperature of PET is 79° C. and of PEN is 118° C.

For instance, the DSSC comprises an optical electrode of a transparent conducting oxide (TCO) and a flexible light transmissible polymeric material on which the TCO is supported and wherein the atomic layer deposition is carried out at a temperature of no more than 150° C.

DETAILED DESCRIPTION

Definitions

"Metal oxide" is used to designate a compound that comprises at least one metal bound to oxygen. Preferably, the metal is selected from the group consisting of metals of Groups IB, IIA, IIB, IIIA, IIIB, IVA, IVB, VA, VB, VIA, VIB and VIII. More preferably, the metal is selected from the group consisting of Mg, Ca, Sr, Ba, Sc, Y, La, Ti, Hf, V, Nb, Ta, Cr, Mo, W, Fe, Ni, Cu, In, Al and Ga. The preferred metal oxide comprises one or more of, for example, titanium oxide, niobium oxide, tungsten oxide, indium oxide, tin oxide, nickel oxide, most preferably titanium oxide, niobium oxide, tungsten oxide, indium oxide, tin oxide, nickel oxide, and the like, but is not necessarily limited thereto. These metal oxides may be used alone or in a mixture of two or more. Preferred examples of the metal oxide include $TiO_2$, $SnO_2$, $WO_3$ $Nb_2O_5$, NiO and $SrTiO_3$.

"Adsorption" is used to designate a physical and/or chemical attachment of atoms or molecules on a surface.

The term "transparent" is used herein to refer to materials allowing at least 50%, preferably at least about 80% visible light (having wavelength of about 400 to about 700 nm).

Throughout the description and the claims of this specification the word "comprise" and variations of the word, such as "comprising" and "comprises" is not intended to exclude other additives, components, integers or steps.

"Particles"/"particulate". Although there is no particular limitation on the particle size of the metal oxides forming the metal oxide layer, the average particle size of primary particles is 5-400 nm and more preferably 5 to 150 nm and most preferably from 5 to 80 nm. For instance, the particulate metal oxide comprises particles of size in the range of from 5 to 400 nm. It is also possible to use a mixture of at least two metal oxides having different particle sizes to scatter incident light and increase quantum yield. In addition, the metal oxide layer may also be formed to have a two or more layered structure using two kinds of metals having different particle sizes. The metal oxides particles form the mesoporous layer to which the dye is adsorbed thus creating a light-absorbing or photoresponsive layer. The mesoporous layer has large surface area in order to enable improved dye incorporation. Accordingly, the metal oxides of the particulate layer preferably have a nanostructure selected from the group consisting of: quantum dots, nanodots, nanorods, nanoparticles with spherical or platelet morphologies, nanotubes, nanobelts and mixtures thereof.

The terms "underlayer", "overlayer" and "top coat" are used herein to refer to the orientations of semiconductor layers with respect to a layer of metal oxide particles supported on a base transparent substrate and optical electrode during construction. The terms overlayer, underlayer and top coat do not refer to the order of respective layers of the final product during operation of the DSSC.

The term "low temperature paste" relates to a semiconductor particulate metal oxide formulation which can be processed at temperatures usually lower than 200° C. For example, Peccell PECC-C01-06 may be processed at about 150° C.

The term "high temperature paste" relates to a semiconductor particulate metal oxide formulation which can be processed at temperatures usually greater than 300° C. For example, Solaronix Ti-Nanoxide 300 is typically processed at about 450° C.

The term "sintering" refers to the formation of interparticle connectivity that involves heating the semiconductor layer of particulate metal oxide to high temperatures, typically about 400° C. or greater for $TiO_2$.

Abbreviations

Voc open-circuit voltage
Jsc short-circuit current density
FF fill factor

The invention uses an optical electrode that may comprise a light transmissible substrate and a conventional transparent conductive oxide (TCO) electrode of the type known for Grätzel DSSCs. The TCO is preferably made in the form of a thin layer of the order of 100 to 5000 nanometers in thickness. The TCO is advantageously made of a material chosen from the group consisting of fluorine doped tin oxide (FTO), antimony or arsenic, indium doped tin oxide (ITO), aluminum stannate, and zinc oxide doped with aluminum.

The person skilled in the art may of course choose any other suitably effective transparent electronic conducting layer. The preferred TCO is ITO or FTO. The TCO may be deposited by a method known in the art such as sputter coating or the like or may be deposited by ALD.

The light transmissible substrate may be a rigid substrate such as glass or flexible material such as a light transmissible polymeric material. Examples of suitable polymeric material may include: polycarbonates such as polycarbonate (bisphenol A polycarbonate, or (2,2-bis 4-hydroxyphenylpropane) carbonate) (PC) modified polycarbonate polycarbonate blended with other polymers, poly(phthalate carbonate) (PPC) and bisphenol A/tetramethylpolycarbonate (PC-TMPC); polyacrylates such as poly(methyl methacrylate) (PMMA) and cycloaliphatic acrylic; polyamides such as transparent polyamide (nylon) (PA-T); polyesters such as poly(ethylene terephthalate) (PET), poly(ethylene naphthalate) (PEN), polyester copolymer (copolyester) and fluorinated copolyester (O-PET); polyarylates (PAr); styrenics such as polystyrene (PS), high-impact polystyrene (HIPS), styrene-acrylonitrile copolymer (SAN), methyl methacrylateacrylonitrile-butadienestyrene copolymer (MABS) and advanced styrenic copolymers; polyetherimides; sulfone polymers such as polysulfone (PSU), poly(ether sulfone) (PES) and poly(phenyl sulfone) (PPSU); poly(ether imide) (PEI); polyimides, such as Kapton H or Kapton E (made by Dupont) or Upilex (made by UBE Industries, Ltd.); polynorbornenes; olefinics such as cyclo-olefinic copolymer (COC), cyclo-olefinic polymer (COP) and clarified polypropylene; liquid crystal polymers (LCP) such as polyetheretherketone (PEEK), polyethylene terephthalate (PET), polyethylene naphtalate (PEN); Poly(phenylene ether) (PPE), poly(phenylene oxide) (PPO), Rigid thermoplastic polyurethane (PUR-R); optically transparent thermosetting polymers including: diethylene glycol bis(allyl carbonate) or allyl diglycol carbonate (CR39); other ophthalmic resins based on sulfur containing monomers, urethane monomers, halogenated aromatic diallyl, divinyl or dimethacrylyl monomers; and other optical polymers such as fluorinated polyimide (PI-f) and poly(methylpentene) (TPX). Products such as Barix™ barrier film, transparent organic-inorganic hybrid materials, transparent nanocomposite materials and similar materials may also be used In context of the present invention, "an ALD process" generally refers to a process for producing thin films over a substrate where the thin film is formed by surface-initiated chemical reactions. The general principles of ALD are disclosed, e.g., in U.S. Pat. Nos. 4,058,430 and 5,711,811, the disclosures of which are incorporated herein by reference. In an ALD process, gaseous reactants, i.e. precursors are conducted into a reaction chamber of an ALD type reactor where they contact a substrate located in the chamber to provide a surface reaction. The pressure, temperature and flow conditions in the reaction chamber are adjusted to a range where physisorption (i.e. condensation) and thermal decomposition of the precursors does not occur or is minimised. In the process of the present invention temperatures are selected having regard to the nature of the substrate and other materials so as to avoid decomposition and to form an effective semiconductor coating layer without a requirement for high temperature processes. Only up to one monolayer (i.e. an atomic layer or a molecular layer) of material is usually deposited at a time during each metal-oxidant pulsing cycle. The actual growth rate of the thin film typically depends on the number of available reactive surface sites or active sites on the surface and the bulkiness and reactivity of the chemisorbing molecules. Gas phase reactions between precursors and any undesired reactions of by-products are inhibited because precursor pulses are separated from each other by time and the reaction chamber is purged with an inactive gas (e.g. nitrogen or argon) and/or evacuated using, e.g., a pump between precursor pulses to remove surplus gaseous reactants and reaction by-products from the chamber.

The number of ALD cycles used is chosen according to the nature and reactivity of the substrate and the reactant gases, the process conditions of temperature, pressure and reactant concentration, and the coating thickness required to provide an effective coating which gives improved performance characteristics. Preferably the number of cycles will be between 1 cycles and 1000 cycles more preferably it is between 2 cycles and 500 cycles.

The invention involves formation via a process comprising atomic layer deposition of a conformal thin film of semiconductor on a layer of metal oxide particles. We have found that atomic layer deposition on a nanoparticulate layer provides an interfacial layer with efficient semiconductor properties without a requirement for high temperature processing.

Without wishing to be bound by theory we believe the significant advantage arises from two aspects. 1/ The ALD process is a non-line of sight process which results in effective coating of a large surface area within a porous nanoparticulate layer. This significantly enhances its performance as a semiconductor while maintaining a high surface area for dye adsorption. 2/ The application of an ALD layer provides an optically transparent layer and a surface for adsorption of dye.

According to the preferred embodiments, an atomic layer deposition (ALD) type process is used to form thin films on the surface of the nanoparticulate metal oxide layer.

In a preferred embodiment of the invention, a substrate having an optical electrode and a nanoparticulate layer thereon is placed in a reaction chamber and subjected to alternately repeated surface reactions. In particular, thin films are formed by repetition of surface-initiated ALD cycles.

Atomic layer deposition (ALD) is a known method of producing a thin metal oxide coating. ALD is based on two or more separate half-reactions between vapour phase reactants and the deposition surface. Film growth is believed to involve the incoming vapour phase reacting by a process of chemisorption with surface functional groups. The process is continued with the separate introduction of the second vapour phase, which reacts with ligands attached to the precursor species previously deposited on the surface. The first half reaction generally involves deposition of a metal compound. The second precursor may then be reacted to provide modification of the adsorbed metal compound. For example, the growth of $TiO_2$ from $TiCl_4$ and $H_2O$ on a hydroxylated surface commences with the chemisorption of $TiCl_4$ to form Ti—O bonds together with some unreacted Ti—Cl terminal ligands. The latter ligands then react with $H_2O$ vapor during the second half-reaction cycle to re-hydroxylate the growth surface and form HCl vapour as a reaction by-product. This process is repeated for a predetermined number cycles to form a $TiO_2$ film of the desired thickness.

In performing ALD, process conditions, including temperatures, pressures, gas flows and cycle timing, are adjusted to meet the requirements of the process chemistry and substrate materials. The temperature and pressure are controlled within a reaction chamber. Typical temperatures used in the process of the invention are less than 400° C. and preferably greater than 25° C., more preferably less than 300° C., e.g. at no more than 299° C., especially at less than 299° C., for example at no more than 250° C., such as at no more than 200° C., in particular at no more than 150° C., for instance at no more than 120° C. and pressure within the range of about 1 to 10,000 Pascal. The conditions used should be chosen having regard to the substrate and temperature needed for treating the metal oxide particles to remove any solvent or carrier used as an aid in deposition of the metal oxide particles.

For instance, the DSSC comprises a light transmissible substrate which is a polymeric material and ALD is conducted at a temperature of no more than 150° C.

An inert purge gas is introduced to remove any excess of the first vapor and any volatile reaction products. The embodiments of the deposition process are described herein as involving purging with an inert gas. The terms "purging" and "purge" are intended to be construed broadly, to include not only flushing of the reaction space by introduction of a flow of an inert gas or other material, but also more generally to include the removal or cleansing of excess chemicals and reaction byproducts from the reaction space. For example, excess chemicals and reaction byproducts may be removed from the reaction space by pumping the reaction space and/or by lowering the pressure within the reaction space. Consistent with the broad definition of the term "purge," the removal of excess chemicals from the reaction space need not be perfectly effective, but will typically involve leaving surface bound chemicals and possibly some insignificant amount of non-surface bound chemicals or residual matter within the reaction space.

Moreover, when a purge gas is used to remove chemicals from the reaction space, various inert purge gases, oxygen ($O_2$) and mixtures thereof may be used. Preferred purge gases include nitrogen ($N_2$), helium (He), neon (Ne), argon (Ar). A constant or pulsed flow of one or more of these purge gases may also be used to transport the first chemical and the second chemical into the reaction space and/or to adjust the pressure within the reaction space.

A second precursor vapor is introduced into the reaction chamber and reacts with the adsorbed first precursor vapor and creates a film conforming to the nanoparticulate structure. As with the first precursor vapor, the second precursor vapor does not react with itself.

Each film growth cycle is typically of the order of a monolayer or less.

The second precursor vapor is purged to remove excess precursor vapor as well as any volatile reaction products. This completes one cycle. This procedure is repeated until the desired thickness of the film is achieved.

Successful ALD growth requires that the precursor vapors be alternately pulsed into the reaction chamber. The ALD process also requires that each starting material be available in sufficient concentration for thin film formation over the substrate area.

Preferred examples of metal reactants for use in the present invention include at least one metal compound selected from the group consisting of:

halides (e.g. $MX_n$ where X is a halogen), preferably chlorides, bromides or iodides, particularly $TiCl_4$ which is liquid at room temperature and particularly useful as a precursor for $TiO_2$;

alkoxides (e.g. $M(OR)_n$ where R is alkyl), preferably $C_1$ to $C_6$ alkoxides and more preferably $C_3$ and $C_4$ alkoxides such as isopropoxide and sec-butoxide and tert-butoxide or a combination thereof. Specific examples of preferred alkoxides include titanium iso-propoxide ($Ti(i-OC_3H_7)_4$) zirconium tert-butoxide ($Zr(t-OC_4H_9)_4$) and niobium ethoxide ($Nb(OC_2H_5)_5$);

β-diketonate chelates (e.g. $M=(O_2C_3R_3)_n$) where R is $C_1$ to $C_4$ alkyl alkylamides (e.g. $M(NR_2)_n$ where R is independently H or alkyl such as $C_1$ to $C_4$ alkyl);

amidinates (e.g. $M(N_2CR_3)_n$ wherein R is independently H or alkyl such as $C_1$ to $C_4$ alkyl); and organometallics (that is compounds wherein the metal is bonded directly to carbon) such as alkyls, including $C_1$ to $C_4$ alkyls, cyclopentadienyls such as dicyclopentadienyldimethyl metal complexes;

wherein the metal species preferably includes at least one metal selected from the group consisting of titanium, niobium, tungsten, indium, tin and zinc.

In the above list M is the metal and n is the number of ligands in the complex and is generally the valency of the metal or, in the case of bidentate ligands, half the metal valency. The metal compounds listed above may be modified after deposition by use of an appropriate second vapour or may be used to provide desirable ligands for interaction with a dye species adsorbed onto the semiconductor.

In the case of a porous particulate metal oxide layer the ALD process used to prepare the interface with the dye allows the metal reagent to penetrate into the particulate layer to coat and form a continuous or discontinuous layer of semiconductor material covering the metal oxide particles.

The layer resulting from the ALD onto the metal oxide is a semiconductor layer and comprises a metal oxide. Preferably, the metal is selected from the group consisting of metals of Groups IIA, IIB, IIIA, IIIB, IVA, IVB, VA, VB, VIA, VIIB and VIII. More preferably, the metal is selected from the group consisting of Mg, Ca, Sr, Ba, Sc, Y, La, Ti, Zr, Hf, V, Nb, Ta, Cr, Mo, W, Fe, Ni, Cu, Zn, In, Al and Ga. The preferred metal oxide comprises one or more of, for example, titanium oxide, tin oxide, zinc oxide, zirconium oxide, niobium oxide, tungsten oxide, indium oxide, nickel oxide, iron oxide, and most preferably titanium oxide, niobium oxide, tungsten oxide, indium oxide, tin oxide, nickel oxide and zinc oxide and the like, but is not necessarily limited thereto. These metal oxides may be used alone or in a mixture of two or more. Particularly preferred examples of the interfacial ALD are selected from the group consisting of $TiO_2$, $SnO_2$, ZnO, $WO_3$, $Nb_2O_5$, $In_2O_3$, $Fe_2O_3$, NiO and $SrTiO_3$ and precursor complexes of the metal ion species. Most particularly preferred examples of the interfacial ALD are selected from the group consisting of $TiO_2$ and $Nb_2O_5$, and precursor complexes of the metal ion species.

Preferred is a DSSC comprising a semiconductor formed from metal oxide particles on an optical electrode, a dye adsorbed onto the semiconductor and wherein the semiconductor interface with the dye and optical electrode is formed by atomic layer deposition of a semiconductor material onto the optical electrode and metal oxide particles.

We have also found that the deposition by ALD of a semiconducting layer (which may be referred to as an underlayer to the metal oxide particles or a compact layer) between the optical electrode and particulate metal oxide layer improves the bonding and integrity of the multilayer system. Accordingly in a preferred embodiment the dye sensitized solar cell comprises a semiconductor formed of (i) an ALD compact layer of semiconductor material, (ii) a metal oxide particulate layer on said compact ALD layer and (iii) a conformal ALD coating of semiconductor on the metal oxide particulate layer.

The invention may involve a process of applying a particulate metal oxide to the optical electrode on a light transmissible substrate. The particulate metal oxide may be applied using a range of methods of general type known in the art for deposition of nanoparticulate metal oxides for forming a semiconductor. In the preferred embodiment the particulate metal oxide is applied as a colloid or paste of particles of size in the range of from 5 to 400 nm and preferably from 5 to 150 nm and most preferably from 5 to 80 nm. Colloidal titanium oxide particles may be prepared by methods known in the art such as by hydrolysis of titanium isopropoxide. Examples of methods for preparation of colloidal titanium dioxide are described for example by Grätzel in U.S. Pat. No. 5,530,644.

For instance, the particulate metal oxide is formed from a colloidal dispersion or paste of metal oxide. For example, the particulate metal oxide comprises metal oxide particles formed by a sol-gel process.

The layer of metal oxide particles is typically in the range of from 0.1 to 100 μm and typically up to 20 μm thick.

The nanoparticle layer of metal oxide may, for example, be prepared by a sol-gel process and deposited on the TCO coated substrate.

The metal oxide particulates can be deposited onto the optical electrode (e.g. the TCO or TCO plus blocking layer, known as the underlayer) by doctor blading, screen-printing, spin coating and/or by spray coating methods. In a typical example, the $TiO_2$ nanoparticles are mixed with an organic vehicle as described in J. M. Kroon Prog. Photovolt. Res. Appl. 15, 1-18, (2007). Typical solids loading are between 2 and 50 weight percent of the nanoparticulate, preferably between 10 to 50. The paste is applied by one of the film forming methods above to create a continuous film on the optical electrode. Following deposition, the resultant film is heated to remove the organic material. The temperature of this organic binder removal is typically between 50° C. and 500° C. which is determined by the composition of the binder and the nature of the substrate.

With the conventional DSSC procedure a heat treatment step of at least about 450° C. would normally be required to sinter the particulates to create both a connective pathway between the semiconducting particles and adhesion to the optical electrode. With a low temperature paste such that removal of volatiles can be carried out at low temperatures such as at less than or equal to 150° C. we find that the efficiency can be improved significantly by ALD overcoating of the particulate layer. The ALD procedure may also be conducted at or below such temperatures so that the entire process of the invention may then be carried out at low temperatures as might be required when a flexible substrate is used.

As the dye in the present invention, any material may be used without any particular limitation as long as it is one compatible with use in the photovoltaic cell field.

According to a further embodiment, the interconnected nanoparticle material is coated with a photosensitizing agent (such as a dye) that includes a molecule selected from the group consisting of anthocyanins, squarates, eosins, xanthines, cyanines, merocyanines, phthalocyanines, indolines, porphyrins, oligothiophenes, coumarins, perylenes and pyrroles.

According to another embodiment the photosensitizing agent is a metal complex that includes a metal atom or ion selected from the group consisting of multivalent metals. Preferably this metal complexes is selected from the group consisting of a ruthenium transition metal complex, an osmium transition metal complex, and an iron transition metal complex.

In one illustrative embodiment, the photosensitizing agent is adsorbed (e.g. chemisorbed and/or physisorbed) on the interconnected nanoparticles. The photosensitizing agent may be adsorbed on the surfaces of the interconnected nanoparticles throughout the interconnected nanoparticles or both. The photosensitizing agent is selected, for example, based on its ability to absorb photons in a wavelength range of operation, its ability to produce free electrons in a conduction band of the interconnected nanoparticles and its effectiveness in complexing with or adsorbing onto the surface of the interconnected nanoparticles. Suitable photosensitizing agents may include, for example, dyes that include functional groups, such as carboxyl and/or hydroxyl groups, that can chelate to the nanoparticles, e.g., to Ti (IV) sites on a $TiO_2$ surface. Examples of suitable dyes include, but are not limited to, anthocyanins, squarates, eosins, xanthines, cyanines, merocyanines, phthalocyanines, indolines, porphyrins, oligothiophenes, coumarins, perylenes and pyrroles. and metal-containing dyes such as ruthenium complexes like $RuL_2(SCN)_2$, $RuL_2(H_2O)_2$, $RuL_3$, and $RuL_2$, wherein L represents 2,2'-bipyridyl-4,4'-dicarboxylate and the like.

For example, cis-bis(isothiocyanato)bis(2,2'-bipyridyl-4,4'-dicarboxylato)-ruthenium (II) ("N3 dye"); tris(isothiocyanato)-ruthenium (II)-2,2':6',2"-terpyridine-4,4',4"-tricarboxylic acid ("black dye"); cis-bis(isothiocyanato)bis(2,2'-bipyridyl-4,4'-dicarboxylato)-ruthenium (II)bis-tetrabutylammonium ("N719 dye"); cis-bis(isothiocyanato) (2,2'-bipyridyl-4,4'-dicarboxylato) (2,2'-bipyridyl-4,4'-dinonyl)ruthenium(II) ("Z907 dye"); and tris(2,2'-bipyridyl-4,4'-dicarboxylato)ruthenium (II)dichloride, all of which are available from Solaronix. Further suitable dyes are those known as indoline dyes such as 5-[[4-[4-(2,2-diphenylethenyl)phenyl]-1,2,3,3a,4,8b-hexahydrocyclopent[b]indol-7-yl]methylene]-2-(3-ethyl-4-oxo-2-thioxo-5-thiazolidinylidene)-4-oxo-3-thiazolidineacetic acid, 5-[[4-[4-(2,2-diphenylethenyl)phenyl]-1,2,3,3a,4,8b-hexahydrocyclopent[b]indol-7-yl]methylene]-2-(3-ethyl-4-oxo-2-thioxo-5-thiazolidinylidene)-4-oxo-3-thiazolidineacetic acid ("D149 indoline dye").

Any dye may be used as long as it has a charge separation function and shows photosensitivity and binds to the metal oxide particulate layer.

In a solar cell that utilizes the inventive semiconductor electrode, the electrolyte layer may be made of any material that has a hole transport function. Examples of a material that can be used to form the electrolyte layer in the present invention include iodide/iodine in a suitable solvent such as acetonitrile or other suitable media.

The process of the invention may provide improved incorporation of the dye by the metal oxide layer. The following procedure may be used to determine the dye uptake of a surface. The dye-covered particulate metal oxide (e.g. $TiO_2$) layer with known surface area is immersed into 4 mL of 0.1 M NaOH (in $EtOH/H_2O$, 50:50 by VN). Once the dye is completely removed from the $TiO_2$ (it turns to white or transparent), the absorption spectra of the solution is measured using UV-Vis spectrophotometry. The amount of dye is calculated using the molar extinction coefficient and normalized to the metal oxide (e.g. $TiO_2$) surface area.

The DSSC of the invention comprises a charge carrier material or electrolyte layer which may be of the type known in the art. The charge carrier may be a liquid, gel, salt or solid electrolyte. The charge carrier material may be any material that facilitates the transfer of electrical charge from a ground potential or a current source to the interconnected nanoparticles (and/or a dye associated therewith). A general class of suitable charge carrier materials can include, but is not limited to solvent based liquid electrolytes, polyelectrolytes, polymeric electrolytes, solid electrolytes, n-type and p-type transporting materials (e.g., conducting polymers, functionalised arylamines, SpiroMeOTAD, organic hole transport materials, etc), and gel electrolytes, which are described in more detail below.

Other choices for the charge carrier material are possible. For example, the electrolyte composition may include a lithium salt that has the formula LiX, where X is an iodide, bromide, chloride, perchlorate, thiocyanate, trifluoromethyl sulfonate, or hexafluorophosphate. In one embodiment, the charge carrier material includes a redox system. Suitable redox systems may include organic and/or inorganic redox systems. Examples of such systems include, but are not limited to, cerium (III) sulfate/cerium (IV), sodium bromide/bromine, lithium iodide/iodine, $Fe^{2+}/Fe^{3+}$, $Co^{2+}/Co^{3+}$, and viologens. Furthermore, an electrolyte solution may have the formula $M_iX_j$, where i and j are greater than or equal to: 1. X is an anion, and M is selected from the group consisting of Li, Cu, Ba, Zn, Ni, lanthanides, Co, Ca, Al, and Mg. Suitable anions include, but are not limited to, chloride, perchlorate, thiocyanate, trifluoromethyl sulfonate, and hexafluorophosphate.

For instance, the electrolyte is iodide/iodine in a (e.g. suitable) solvent such as acetonitrile.

In some illustrative embodiments the charge carrier material includes a polymeric electrolyte. In one version, the polymeric electrolyte includes poly(vinyl imidazolium halide) and lithium iodide. In another version, the polymeric electrolyte includes poly(vinyl pyridinium salts). In still another embodiment, the charge carrier material includes a solid electrolyte. In one version, the solid electrolyte includes lithium iodide and pyridinium iodide. In another version, the solid electrolyte includes substituted imidazolium iodide. In another version, the solid electrolyte includes (2,2',7,7'-tetrakis-(N,N-di-p-methoxyphenylamine)-9,9'-spirobifluorene), t-butyl pyridine and bis((trifluoromethane)sulfonamide lithium salt.

According to some illustrative embodiments, the charge carrier material includes various types of polymeric polyelectrolytes. In one version, the polyelectrolyte includes between about 5% and about 100% (e.g., 5-60%, 5-40%, or 5-20%) by weight of a polymer, e.g., an ion-conducting polymer, about 5% to about 95%, e.g., about 35-95%, 60-95%, or 80-95%, by weight of a plasticizer and about 0.05 M to about 10 M of a redox electrolyte, e.g., about 0.05 M to about 10 M, e.g., 0.05-2 M, 0.05-1 M, or 0.05-0.5 M, of organic or inorganic iodides, and about 0.01 M to about 1 M, e.g., 0.05-5 M, 0.05-2 M, or 0.05-1 M, of iodine. The ion-conducting polymer may include, for example, polyethylene oxide (PEO), polyacrylonitrile (PAN), certain acrylics, polyethers, and polyphenols. Examples of suitable plasticizers include, but are not limited to, ethyl carbonate, propylene carbonate, mixtures of carbonates, organic phosphates, butyrolactone, and dialkylphthalates.

Specific embodiments of the invention will be discussed with reference to the accompanying drawings, in which:

FIG. 1 shows a schematic cross section views and general construction process of a DSSC in accordance with the invention for use with liquid electrolytes.

Figure 1A:
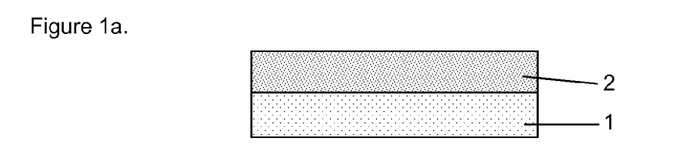
FIGS. 1a to 1d show stages used in a process for preparing a DSSC in accordance with the invention for use with liquid electrolytes.
Figure 1B:
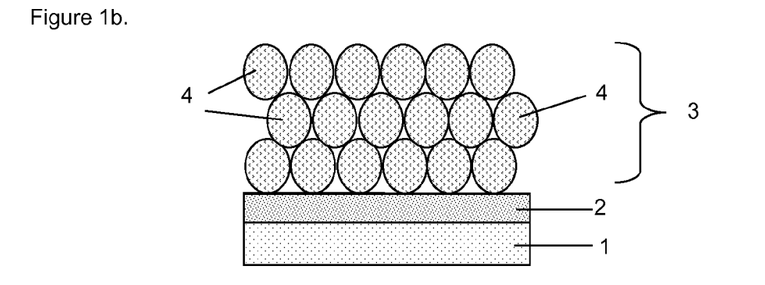
Figure 1C:
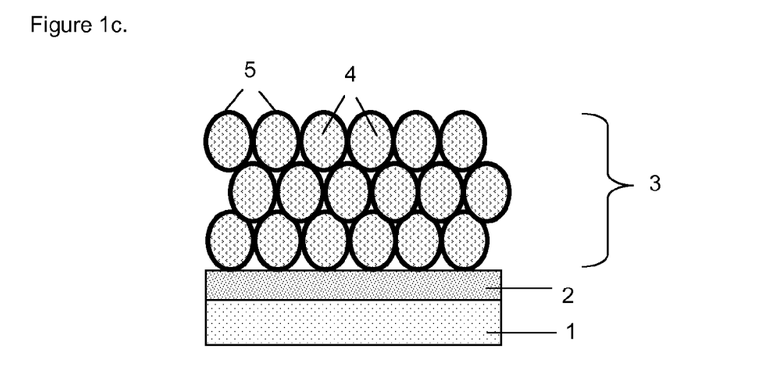
Figure 1D:
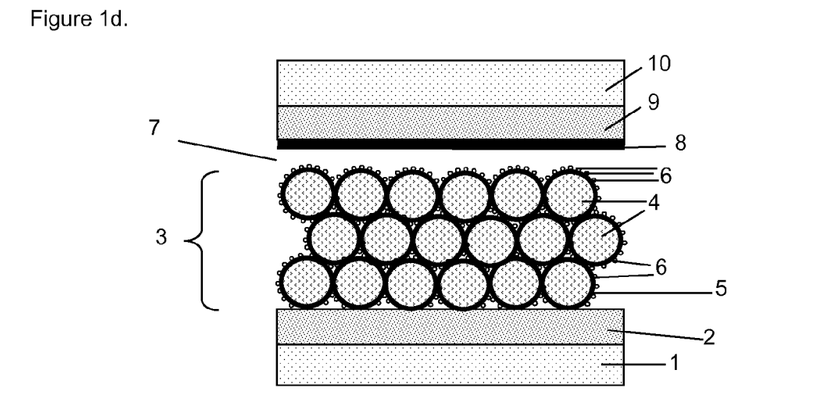

(i) the cell is based on a TCO electrode (2) supported on a transparent substrate (1) as shown in FIG. 1a;

(ii) (referring to FIG. 1b) depositing a layer (3) of metal oxide nanoparticles (4) onto the TCO layer (2). At this stage the layer of particles (3) is generally not an optimised semiconductor. This layer can be heated or sintered in accordance with the procedures described in the examples;

(iii) applying an ALD conformal coating (5) of semiconductor to the particles of metal oxide (4) supported on the substrate (1) and TCO film (2) as shown in FIG. 1c; and (iv) (referring to FIG. 1d), depositing a dye (6) onto the ALD coated particles so it is adsorbed on the ALD coated surface of the particles (5). The assembly may be completed with the electrolyte (7), counter electrode (8) on TCO (9) and substrate (10), in accordance with procedures known in the art to provide an operational DSSC.

FIG. 2 shows a schematic cross section views and general construction process of a DSSC in accordance with the invention for use with liquid electrolytes and ionic liquid electrolytes. This underlayer is optional for liquid electrolytes though is preferred as it leads to improved overall performance in combination with the ALD topcoat applied to particles of metal oxide.

Figure 2A:
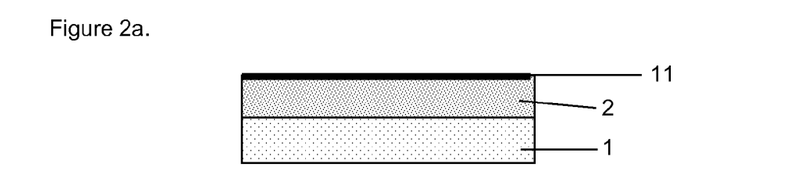
FIGS. 2a to 2d show stages used in a process for preparing a DSSC in accordance with the invention for use with liquid electrolytes and ionic liquid electrolytes.
Figure 2B:
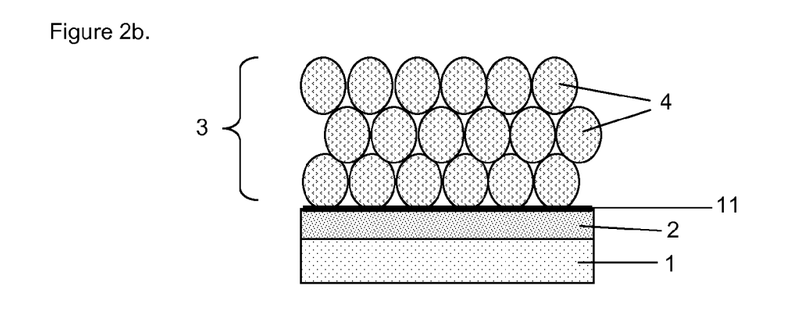
Figure 2C:
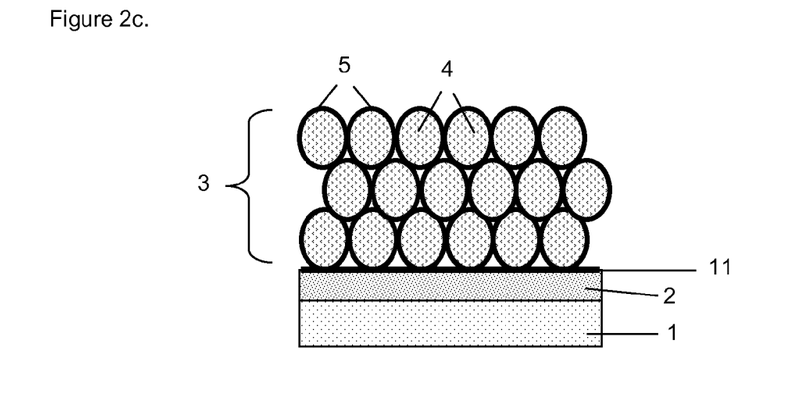
Figure 2D:
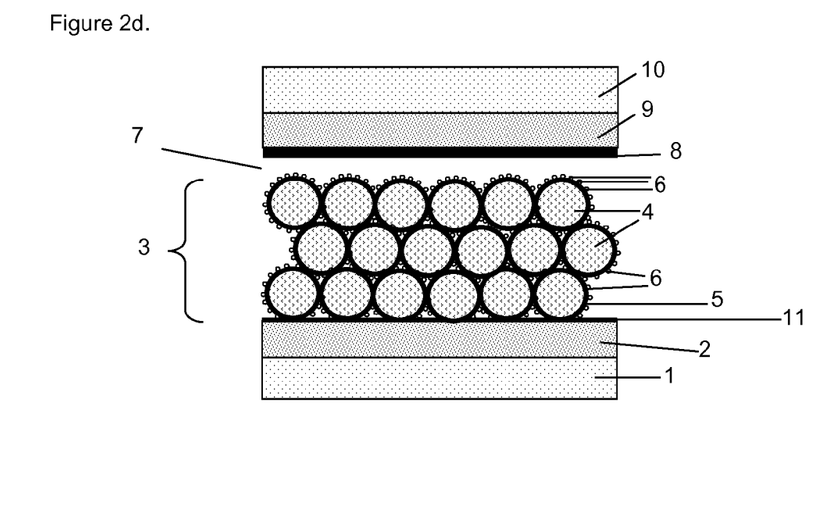

(i) depositing a compact layer (11) of metal oxide typically by ALD (but alternatively be deposited by spin coating or spray pyrolysis in the case of a glass substrate) on the TCO electrode (2) (i.e. typically FTO) supported on a transparent substrate (1) as shown in FIG. 2a;

(ii) (referring to FIG. 2b) depositing a layer (3) of metal oxide nanoparticles (4) onto the metal oxide compact layer (11), commonly referred to as the underlayer. At this stage the layer (3) is generally not an optimised semiconductor. This layer (3) can be heated or sintered in accordance with the procedures described in the examples to improve the semiconducting properties;

(iii) applying an ALD conformal coating (5) of semiconductor to particles of metal oxide (4) supported on the substrate (1), TCO film (2) and metal oxide compact layer (11) as shown in FIG. 2c; and (iv) (referring to FIG. 2d), depositing a dye (6) onto the ALD coated particles so it is adsorbed on the ALD coated surface of the particles (5). The assembly may be completed with the electrolyte (7), counter electrode (8) on TCO (9) and substrate (10), in accordance with procedures known in the art to provide an operational DSSC.

FIG. 3 shows a schematic cross section views and general construction process of a DSSC in accordance with the invention for use with solid state electrolytes;

Figure 3A:
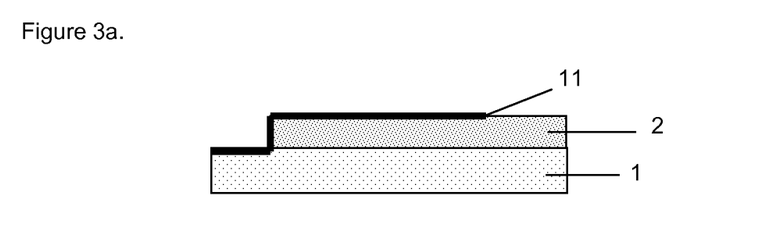
FIGS. 3a to 3d show stages used in a process for preparing a solid state DSSC in accordance with the invention.
Figure 3B:
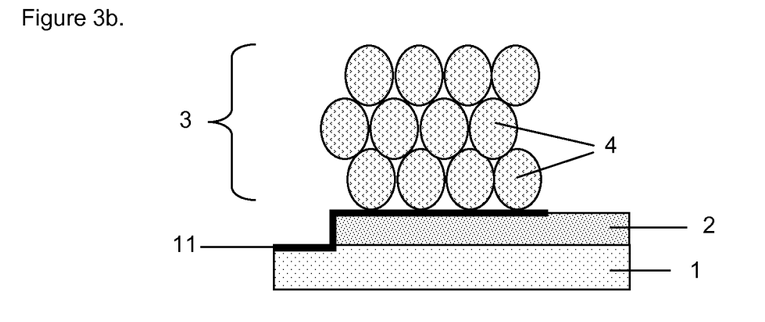
Figure 3C:
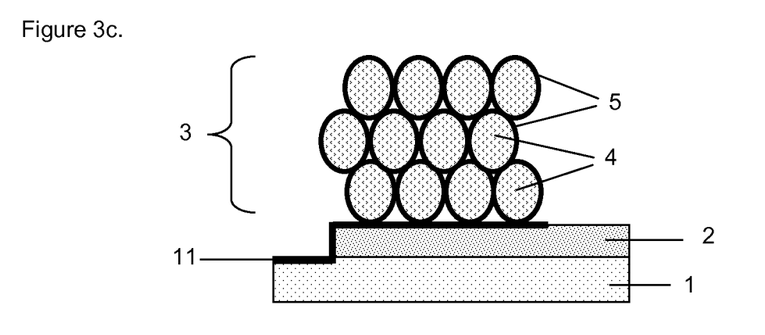
Figure 3D:
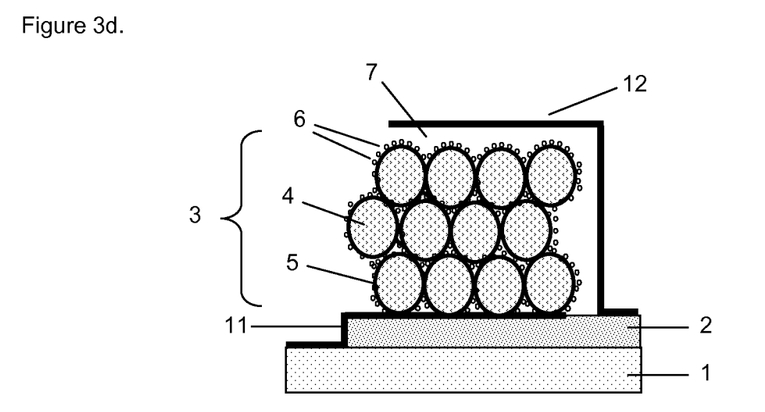

(i) depositing a compact layer (11) of metal oxide typically by ALD (but alternatively be deposited by spin coating or spray pyrolysis in the case of a glass substrate) on the TCO electrode (2) (i.e. typically FTO) supported on a transparent substrate (1) as shown in FIG. 3a;

(ii) (referring to FIG. 3b) depositing a layer (3) of metal oxide nanoparticles (4) onto the metal oxide compact layer (11), commonly referred to as the underlayer. At this stage the layer (3) is generally not an optimised semiconductor. This layer (3) can be heated or sintered in accordance with the procedures described in the examples to improve the semiconducting properties;

(iii) applying an ALD conformal coating (5) of semiconductor to particles of metal oxide (4) supported on the substrate (1), TCO film (2) and metal oxide compact layer (11) as shown in FIG. 3c; and (iv) (referring to FIG. 3d), depositing a dye (6) onto the ALD coated particles so it is adsorbed on the ALD coated surface of the particles (5). The assembly may be completed with the electrolyte (7) and metal counter electrode (12), which is deposited by evaporation, in accordance with procedures known in the art to provide an operational DSSC.

The invention will now be described with reference to the following examples. It is to be understood that the examples are provided by way of illustration of the invention and that they are in no way limiting to the scope of the invention.

EXAMPLES

Experimental Section

Definitions

Peccell (product name PECC-C01-06) is a paste that does not contain resin binders containing 8-9% by weight of 60 nm particles of titanium dioxide anatase.

Solaronix (product name Ti-Nanoxide 300) is a paste with organic binders and solvents containing a mixture of sub 60 nm particles of titanium dioxide and about 20% wt. of 400 nm sized titanium dioxide anatase particles, acting as optical dispersant.

Examples Using Particulate Metal Oxide Pastes

Low Temperature Paste.

The semiconductor particulate metal oxide photoanode is prepared using low temperature $TiO_2$ paste formulation from Peccell (product name PECC-C01-06). The film is doctor bladed onto the substrate or ALD layer. The thickness of the titania particulate layer is controlled using either one or two layers of 3M Scotch Magic Tape (Catalogue No 810). The paste is allowed to dry at room temperature before thermal treatment in the ALD chamber.

High Temperature Paste.

The semiconductor particulate metal oxide photoanode is prepared using a $TiO_2$ paste formulation from Solaronix (product name Ti-Nanoxide 300). Ti-Nanoxide 300 is a paste containing about 20% wt. of 400 nm sized titanium dioxide anatase particles, acting as optical dispersant. $TiO_2$ particulate films is doctor bladed onto the conductive side of the substrates using a clean glass pipette. The thickness of the $TiO_2$ particulate layer is regulated by using either a single or double layer of 3M Scotch Magic Tape (Catalogue No 810) applied along the first 5 mm of each long edge of the substrate. The paste is allowed to dry at room temperature before thermal de-binding and sintering to 450° C. for 30 minutes.

Preparation of In-House Particulate Metal Oxide Paste

In one embodiment, the particulate metal oxide is prepared from $SnO_2$. The semiconducting $SnO_2$ powder is produced from hydrothermal methods using $SnCl_4$ as the precursor and a procedure described by M. Anpo et al., J. Phys. Chem. Vol 91, pages 4305-4310 (1987). The paste containing $SnO_2$ metal oxide particulates is prepared using organic vehicles, ethyl cellulose (EC-100FTR, Nisshin Kasei) in terpineol using a 3 roll mill (M-50 EXAKT) as described by S. Ito et al., Thin solid films 516, pages 4613-4619 (2008). The final paste composition contains 22.7 wt % of $SnO_2$.

Glass and Polymer Substrates (Liquid DSSC).

The photoanode electrode represented in the examples below is prepared on either glass or polymer substrate. The glass substrates are Asahi FTO glass substrates (sheet resistance: 12 Ohm per square, effective transmittance>80%, haze: 10-20%, glass side thickness: 1.8 mm) cut into 1.8 cm by 1.6 cm rectangles. The substrates are cryogenically cleaned on the conductive side with a liquid $CO_2$ and dried before the deposition of either the semiconductor particulate metal oxide or application an ALD layer. The polymer substrate is ITO coated polyethylene naphthalate (PEN) (sheet resistance: 13 Ohm per square, 200 micrometers thick) that is cut into 1.8 cm by 1.6 cm rectangles. The polymer substrates are gently wiped with ethanol then cryogenically cleaned on the conductive side with a liquid $CO_2$ and dried.

After drying, the surrounding edges of the substrate that are not coated with paste are masked with pieces of soda glass during the ALD process.

Atomic Layer Deposition Process

ALD layers are deposited in one of two configurations as outlined in the drawings. An ALD top coat is applied after the deposition and treatment of the semiconductor particulate layer. When an ALD underlayer and overlayer design is used, the first ALD layer is deposited directly onto the TCO coated glass or polymer substrate before the semiconductor particulate layer. A further deposition of an ALD layer onto the semiconductor metal oxide produces dual layered DSSC architecture.

ALD layers are deposited using a flow-type hot-walled F-120 ALD reactor from ASM Microchemistry. Substrates are positioned in the hot-zone of the vacuum chamber, in the centre of the gas flow, on a microscope glass slide for support. The chamber is continually flushed with nitrogen gas flowing at 350/200 sccm, and pressure is maintained at less than 1 mbar. Precursor vapour is delivered to the vacuum chamber coating all exposed surfaces. Coating is completed at the temperature range specified in the examples.

In several embodiments, the ALD $TiO_2$ is formed at a deposition temperature of 120° C. using titanium tetrachloride ($TiCl_4$) and water ($H_2O$). Precursor vapour from $TiCl_4$ and $H_2O$ are delivered from Peltier cooled reservoirs maintained at 20° C. The pulsing sequence is based on published papers where pulsing duration is typically 0.5 seconds exposure to $TiCl_4$ followed by a 1.0 second nitrogen-only purge, then 1.0 second exposure to water followed by a 1.5 second nitrogen-only purge. An additional pulsing regime follows the first set where pulsing duration is altered to 0.4 seconds exposure to $TiCl_4$ followed by a 10 second nitrogen-only purge, then 1.0 second exposure to water followed by a 10 second nitrogen-only purge. The thickness of the $TiO_2$ layer is controlled by the number of deposition cycles.

In several embodiments, after the ALD $TiO_2$ layer is formed at a deposition temperature of 120° C. using titanium tetrachloride ($TiCl_4$) and water ($H_2O$), 20 additional water ($H_2O$) pulses are applied.

In one embodiment, the ALD $TiO_2$ is formed at a deposition temperature of 200° C. using titanium tetrachloride ($TiCl_4$) and water ($H_2O$). Precursor vapour from $TiCl_4$ and $H_2O$ are delivered from Peltier cooled reservoirs maintained at 20° C. The pulsing sequence is based on published papers where pulsing duration is typically 0.4 seconds exposure to $TiCl_4$ followed by a 0.5 second nitrogen-only purge, then 0.5 second exposure to water followed by a 0.5 second nitrogen-only purge. The thickness of the $TiO_2$ layer is controlled by the number of deposition cycles.

In another embodiment, the ALD $TiO_2$ is formed at a deposition temperature of 250° C. using titanium iso-propoxide ($Ti(i-OC_3H_7)_4$) and water ($H_2O$). Precursor vapour from the ($Ti(i-OC_3H_7)_4$) is delivered by an open boat with the vacuum chamber at 50° C. The water is delivered from a Peltier cooled reservoir maintained at 20° C. The pulsing sequence is typically 1.0 second exposure to ($Ti(i-OC_3H_7)_4$) followed by a 1.0 second nitrogen-only purge, then 1 second exposure to water followed by a 2 second nitrogen-only purge. The thickness of the $TiO_2$ layer is controlled by the number of deposition cycles.

In several embodiments, the ALD $Nb_2O_5$ is formed using precursors niobium ethoxide ($Nb(OC_2H_5)_5$) and water ($H_2O$). Precursor vapour from the ($Nb(OC_2H_5)_5$) is delivered by an open boat with the vacuum chamber at 95° C. The water is delivered from a Peltier cooled reservoir maintained at 20° C. The pulsing sequence is typically 0.5 second exposure to ($Nb(OC_2H_5)_5$) followed by a 0.5 second nitrogen-only purge, then 2 second exposure to water followed by a 2 second nitrogen-only purge. The ALD process is performed at a temperature range between 200° C. and 300° C. The thickness of the $Nb_2O_5$ layer is controlled by the number of deposition cycles.

All control samples are processed at the same temperature zone as the specimens being topcoated but placed in a region of the reactor where there is no exposure to the precursor vapour.

DSSC Assembly

Following ALD coating, samples of the metal oxide photoanode are removed from the vacuum chamber and placed in standard N719 dye (cis-bis(isothiocyanato)bis(2,2'-bipyridyl-4,4'-dicarboxylato)-ruthenium(II) bis-tetrabutylammonium, Solaronix) solution for 1 day, consisting of 0.3 mM in acetonitrile (anhydrous, 99.8%, Sigma)/2-methyl-2-propanol (99%, Alfa Aesar) (1:1) (V:V).

DSSCs are assembled with an active area of ~0.64 $cm^2$. Sandwich-type photovoltaic devices are assembled using the dye sensitized, ALD coated or non-ALD coated semiconductor particulate layer as photoanodes and sputtered Pt (8 nm) on ITO glass as counter electrodes. A 25 μm thick, polymer film (SX 1170-25, Solaronix) is used as a spacer between the glass photoanode and counter electrode. A 60 μm thick, polymer film (SX 1170-60, Solaronix) is used as a spacer between the polymer photoanode and counter electrode. In the case of sealed cells the sandwich type device is held together and placed on a hotplate for sealing by placing Pt counter electrode face down at a temperature of approximately 120° C. to 135° C., so that the polymer spacer melts and seals the cell. The electrolyte consisting of 0.6 M 1-propyl-2,3-dimethylimidazolium iodide (DMPII, Solaronix), 0.03 M iodine (Suprapur, Merck), 0.1 M guanidium thiocyanate (for molecular biology, Sigma), 0.5 M 4-tert-butylpyridine (99%, Aldrich) is dissolved in a 85:15 mixture by volume of acetonitrile (anhydrous, 99/8%, Sigma) and valeronitrile (99.5% Sigma). The electrolyte is injected into the space between the semiconductor photoanode and counter electrode.

Glass Substrates (Ionic Liquid DSSC with Underlayer—Spray Pyrolysis or ALD Methods The underlayer in an ionic liquid DSSC can be made by a number of methods. In these examples, they are deposited by the ALD method (as described earlier) or by spray pyrolysis (described below).

The photoanode electrode represented in the ionic liquid examples below is prepared on glass substrate. The glass substrates are Asahi FTO glass substrates (sheet resistance: 12 Ohm per square, effective transmittance>80%, haze: 10-20%, glass side thickness: 1.8 mm) are cut into 2 (top) cm by 2.5 (length) cm rectangles.

The substrates are cleaned with sonication, in the following order; in solutions of 10% aqueous Decon 90, distilled water and finally ethanol (Absolute, Merck) at 20 minutes for each cycle and then dried. These FTO substrates can be subjected to ALD or spray pyrolysis treatment.

Spray pyrolysis is performed on the FTO glass heated at 450° C. by spraying with an ethanolic solution of diisoproxy titanium(IV) bis(acetylacetonate) [$Ti(acac)_2(i-C_3H_7O)_2$] (Aldrich) and heating for a further 5 minutes. The spray pyrolysis solution, deposition method and underlayer optimisation is based on the protocol of Thelekkat et al. Coordin. Chem. Rev., 248, 1479-1489 (2004). The titania photoanode is screen printed in the centre of the FTO glass and covers a section of the underlayer. The surrounding edges of the substrate that are not coated with paste are masked during the ALD topcoat process.

The photoanode is reactivated at a temperature used to form the topcoat and kept there for 60 minutes. The samples are placed in N719 dye (cis-bis(isothiocyanato)bis(2,2'-bipyridyl-4,4'-dicarboxylato)-ruthenium(II) bis-tetrabutylammonium, Solaronix) solution for 1 day consisting of 0.3 mM in acetonitrile (anhydrous, 99.8%, Sigma)/2-methyl-2-propanol (99%, Alfa Aesar) (1:1) (V:V).

DSSCs are assembled with an active area of ~0.64 $cm^2$. Sandwich-type photovoltaic devices are assembled using the dye sensitized, spray pyrolysis or ALD underlayer and with or without ALD topcoated semiconductor particulate layer as photoanodes and sputtered Pt (12-15 nm) on ITO glass as counter electrodes. A 25 μm thick, polymer film (SX 1170-25, Solaronix) is used as a spacer between the photoanode and counter electrode. The sandwich type device is held together and placed on a hotplate for sealing by placing Pt counter electrode face down at a temperature of 135° C., so that the polymer between the glass construction melts and seals the cell.

The electrolyte consists of ionic liquid consists of 5M 1-hexyl-3-methylimidiazolium iodide (Shikoku, CAS No. 178631-05-5) and 0.5M Iodine (99.8%, Aldrich). The electrolyte is vacuum filled through a small hole in the Pt electrode and closed by heat sealing with polymer film (SX 1170-

25, Solaronix) and a glass cover slip. The sample is left in the dark for 1 day to stabilize and then photovoltaic data is acquired.

Glass Substrates (Solid State DSSC with Underlayer—Spray Pyrolysis or ALD Methods)

The underlayer in the solid state DSSC can be made by a number of methods. In these examples, they are deposited by the ALD method (as described earlier) or by spray pyrolysis (described below).

The photoanode electrode represented in the solid state examples below is prepared on glass substrate. The glass substrates are Asahi FTO glass (sheet resistance: 12 Ohm per square, effective transmittance>80%, haze: 10-20%, glass side thickness: 1.8 mm) are cut into 2.5 cm (length) by 2 cm (top) rectangles.

The substrates are cleaned with sonication, in the following order; in solutions of 10% aqueous Decon 90, distilled water and finally ethanol (Absolute, Merck) at 20 minutes for each cycle and then dried.

From the top of the FTO glass sample, a 11 mm section is left exposed, while the remaining FTO surface is covered with a layer of 3M Scotch Magic Tape (Catalogue No 810). The exposed FTO surface is removed by treatment with zinc powder (95%, Merck) and 1M HCl aqueous solution. This process is repeated until all the exposed FTO is removed.

Spray pyrolysis is performed on this etched FTO glass substrate. From the bottom of the FTO glass sample, a 6 mm section is masked, while the remaining FTO surface is left exposed for spray pyrolysis or ALD coating. The conditions and method for ALD deposition are described earlier, while spray pyrolysis is described below. This masked FTO glass is heated at 450° C. and an ethanolic solution of di-isoproxy titanium(IV) bis(acetylacetonate) [Ti(acac)$_2$(i-C$_3$H$_7$O)$_2$] (Aldrich) is repeatedly sprayed over this surface to give the desired underlayer material. These FTO samples are heated for a further 5 minutes. The spray pyrolysis solution, deposition method and underlayer optimisation is based on the protocol of Thelekkat et al., Coordin. Chem. Rev., 248, 1479-1489 (2004). The titania photoanode is screen printed on the patterned FTO glass, whereby a 11 (top) mm×8 (length) mm rectangle is deposited in the centre of this rectangular glass. The photoanode covers sections of the patterned FTO that consists of the underlayer/FTO/glass and underlayer/glass surfaces. The surrounding edges of the substrate that are not coated with paste are masked during the ALD topcoat process.

The photoanode is reactivated at a temperature used to form the topcoat and kept there for 60 minutes. The samples are placed in standard N719 dye (cis-bis(isothiocyanato)bis (2,2'-bipyridyl-4,4'-dicarboxylato)-ruthenium(II) bis-tetrabutylammonium, Solaronix) solution for 1 day, consisting of 0.3 mM in acetonitrile (anhydrous, 99.8%, Sigma)/2-methyl-2-propanol (99%, Alfa Aesar) (1:1) (V:V).

The samples are removed from the dye solution and dried under air while in the dark for 10 minutes. The dye coated photoanode is then treated with hole transport material electrolyte solution. The electrolyte solution consists of 170 mM SpiroMeOTAD (2,2',7,7'-tetrakis-(N,N-di-p-methoxyphenylamine)-9,9'-spirobifluorene), 13 mM bis((trifluoromethane) sulfonamide lithium salt ((CF$_3$SO$_2$)$_2$NLi) (99.95% Aldrich), 130 mM t-butyl pyridine (99%, Aldrich) dissolved in chlorobenzene (99.5%, BDH AnalaR). A 100 µL portion of this electrolyte solution is spin coated onto the photoanode twice. The substrate is then placed in a glovebox antechamber and evacuated/purged to obtain a nitrogen atmosphere. The sample is then placed in the Edwards evaporator and evacuated to ~2.5×10$^{-6}$ mbar before gold is deposited in. The thickness is measured by a quartz microbalance sensor and is ~100 nm. The sample is removed and run 1 day later to obtain photovoltaic data. These cells are not masked as the cell sizes are much smaller than the liquid and ionic liquid cells.

Photovoltaic Performance

Both control and ALD coated DSSCs are tested using a 1000 W Solar Simulator (Newspec Ltd) equipped with an AM 1.5 G filter (Newspec Ltd.). The light intensity is adjusted to 100 mW cm$^{-2}$ using a calibrated Si photodetector (PECSI01, Peccell Technologies, Inc.). A black paper or ink mask with open area of ~0.81 cm$^2$ is attached to the FTO glass facing the solar simulator. The current voltage curves are recorded using a source-measure unit (2400, Keithley Instruments), controlled by a custom-made Labview program. The voltage is swept from 850 mV to −30 mV in 5 mV steps. The settling time is 40 ms between each measurement point.

The results in the associated tables are averages of the data generated for each of the cells described in the examples. Usually four cells are assembled for each of the experimental conditions, although in the case of ionic liquid and solid state cells eight cells are usually prepared for each experimental condition.

Description of Examples

Examples 1 to 3 of liquid DSSCs in open configuration are described in detail. Further examples of DSSCs in closed configuration are described more concisely and are included in order to highlight the scope of the invention. Unless otherwise stated, the preparation of these cells follows the experimental methods described above.

The results in the associated tables are averages of the data generated for each of the cells described in the examples. Usually four cells are assembled for each of the experimental conditions, although in the case of ionic liquid and solid state cells eight cells are usually prepared for each experimental condition.

Example 1

ALD Topcoat

The effect of ALD deposition onto a titania paste in preparation of a DSSCs at low temperature is investigated by the following procedure:

The Asahi FTO glass substrates (sheet resistance: 12 Ohm per square, effective transmittance>80%, haze: 10-20%, glass side thickness: 1.8 mm) are cut to 7 cm by 3 cm rectangles.

The substrates are then cryogenically cleaned on the conductive side with a liquid CO$_2$ spray, and then UV-O$_3$ treated for 18 min.

The low temperature titania paste from Peccell (product name PECC-C01-06) is doctor bladed twice onto the conductive side of the substrates using a clean glass pipette. The thickness of the first layer is regulated by two layers of 3M Scotch Magic Tape (Catalogue No 810) applied along the first 5 mm of each long edge of the substrate. The paste is allowed to dry prior to application of the second layer. The thickness of the second layer is regulated by one layer of 3M Scotch Magic Tape (Catalogue No 810) applied along the first 5 mm of each long edge of the substrate. The films are heated in an oven to a maximum of 150° C. for 4 hours.

After drying of the second doctor bladed layer of paste, an ALD coating of TiO$_2$ is applied (300 cycles) on top of the doctor bladed paste (sample #2). The surrounding edges of the substrate that are not coated with paste are masked with pieces of soda glass attached with metal clips, in order to prevent coating of the conductive FTO during the ALD process.

The thin films of titania are deposited using a flow-type hot-walled F-120 ALD reactor from ASM Microchemistry. Substrates are positioned in the hot-zone of the vacuum chamber, in the centre of the gas flow, on a microscope glass slide for support. The chamber is continually flushed with nitrogen gas flowing at 350/200 sccm, and pressure is maintained at less than 1 mbar. Precursor vapour from titanium tetrachloride ($TiCl_4$) and water is delivered from Peltier cooled reservoirs maintained at 20° C. The pulsing sequence chosen is 0.5 seconds exposure to $TiCl_4$ followed by a 1.0 second nitrogen-only purge, then 1.0 second exposure to water followed by a 1.5 second nitrogen-only purge. Coating processes are completed at 150° C. and the thickness of the titania coating is controlled by the number of deposition cycles.

Prior to immersion the ALD coated samples are heated to 150° C. for 4 hours in an oven. The samples are placed in standard N719 dye (cis-bis(isothiocyanato)bis(2,2'-bipyridyl-4,4'-dicarboxylato)-ruthenium(II) bis-tetrabutylammonium, Solaronix) solution for 3 days, consisting of 0.3 mM in acetonitrile (anhydrous, 99.8%, Sigma)/2-methyl-2-propanol (99%, Alfa Aesar) (1:1) (V:V).

Three DSSCs for each condition are fabricated with an active area of ~0.64 $cm^2$. Sandwich-type photovoltaic devices are assembled using the dye sensitized $TiO_2$ films as photoanodes and sputtered Pt (8 nm) on ITO glass as counter electrodes. A 25 μm thick, U-shaped polymer film (SX 1170-25, Solaronix) is used as a spacer between the photoanode and counter electrode. The sandwich type device is held together using foldback clips. The electrolyte consisting of 0.6 M 1-propyl-2,3-dimethylimidazolium iodide (DMPII, Solaronix), 0.03 M iodine (Suprapur, Merck), 0.1 M guanidium thiocyanate (for molecular biology, Sigma), 0.5 M 4-tert-butylpyridine (99%, Aldrich) dissolved in a 85:15 mixture by volume of acetonitrile (anhydrous, 99.8%, Sigma) and valeronitrile (99.5% Sigma). The electrolyte is injected into the space between the $TiO_2$ photoanode and counter electrode. The photovoltaic performance is tested using a 1000 W Solar Simulator (Newspec Ltd) equipped with an AM 1.5 G filter (Newspec Ltd.). The light intensity is adjusted to 100 mW $cm^{-2}$ using a calibrated Si photodetector (PECSI01, Peccell Technologies, Inc.). A black paper mask with open area of 0.81 $cm^2$ is attached to the FTO glass facing the solar simulator. The current voltage curves are recorded using a source-measure unit (2400, Keithley Instruments), controlled by a custom-made Labview program. The voltage is swept from 850 mV to −30 mV in 5 mV steps. The settling time is 40 ms between each measurement points.

Results

The results in the table are averages of the data generated for each of the cells described above.

| Sample | Jsc (mA·$cm^{-2}$) | Voc (mV) | FF | Efficiency (%) | Normalised efficiency |
|---|---|---|---|---|---|
| no ALD | 8.2 | 730 | 0.62 | 3.7 | 1.00 |
| 300 cycle ALD top coat | 8.9 | 738 | 0.61 | 4.0 | 1.08 |

Efficiency increases by 8%

Example 2

In-Situ ALD Topcoat

As a comparison to Example 1 (above), in this experiment the ALD deposition and film drying are performed at the same time inside the ALD reaction chamber at 120° C. using the following procedure:

The Asahi FTO glass substrates (sheet resistance: 12 Ohm per square, effective transmittance>80%, haze: 10-20%, glass side thickness: 1.8 mm) are cut to 7 cm by 3 cm rectangles.

The substrates are then cryogenically cleaned on the conductive side with a liquid $CO_2$ spray, and then UV-$O_3$ treated for 18 min.

The low temperature titania paste from Peccell (product name PECC-C01-06) is doctor bladed twice onto the conductive side of the substrates using a clean glass pipette. The thickness of the first layer is regulated by two layers of 3M Scotch Magic Tape (Catalogue No 810) applied along the first 5 mm of each long edge of the substrate. The paste is allowed to dry prior to application of the second layer. The thickness of the second layer is regulated by one layer of 3M Scotch Magic Tape (Catalogue No 810) applied along the first 5 mm of each long edge of the substrate.

After drying of the second doctor bladed layer of paste, an ALD coating of $TiO_2$ is applied (300 or 500 cycles) on top of the doctor bladed paste (sample #2 or #3). The two edges of the substrate that are not coated with paste are masked with pieces of soda glass attached with metal clips, in order to prevent coating of this area during the ALD process.

The thin films of titania are deposited using a flow-type hot-walled F-120 ALD reactor from ASM Microchemistry. Substrates are positioned in the hot-zone of the vacuum chamber, in the centre of the gas flow, on a microscope glass slide for support. The chamber is continually flushed with nitrogen gas flowing at 350/200 sccm, and pressure is maintained at less than 1 mbar. Precursor vapour from titanium tetrachloride ($TiCl_4$) and water is delivered from Peltier cooled reservoirs maintained at 20° C. The pulsing sequence chosen is 0.5 seconds exposure to $TiCl_4$ followed by a 1.0 second nitrogen-only purge, then 1.0 second exposure to water followed by a 1.5 second nitrogen-only purge. Coating processes are completed at 150° C. and the thickness of the titania coating is controlled by the number of deposition cycles. The control sample (sample #1) is heated within the ALD heating zone, but outside the reaction chamber, therefore resulting in the same thermal drying cycle as the coated samples.

The samples are taken from the ALD furnace and placed into the dye solution immediately, consisting of 0.3 mM N719 dye (cis-bis(isothiocyanato)bis(2,2'-bipyridyl-4,4'-dicarboxylato)-ruthenium(II) bis-tetrabutylammonium, Solaronix) and 0.15 mM chenodeoxycholic acid (Fluka). in acetonitrile (anhydrous, 99.8%, Sigma)/2-methyl-2-propanol (99%, Alfa Aesar) (1:1) (V:V). The substrates are kept in the dye solution for 11 days.

Four DSSCs for each condition are fabricated with an active area of ~0.6 $cm^2$. Sandwich-type photovoltaic devices are assembled using the dye sensitized $TiO_2$ films as photoanodes and sputtered Pt (8 nm) on ITO glass as counter electrodes. A 25 μm thick, U-shaped polymer film is used as a spacer between the photoanode and counter electrode. The sandwich type device is held together using foldback clips (SX 1170-25, Solaronix). The electrolyte consisting of 0.6 M 1-propyl-2,3-dimethylimidazolium iodide (DMPII, Solaronix), 0.03 M iodine (Suprapur, Merck), 0.1 M guanidium thiocyanate (for molecular biology, Sigma), 0.5 M 4-tert-butylpyridine (99%, Aldrich) dissolved in a 85:15 mixture by volume of acetonitrile (anhydrous, 99.8%, Sigma) and valeronitrile (99.5% Sigma). The electrolyte is injected into the space between the $TiO_2$ photoanode and counter electrode, and the photovoltaic performance is tested using a 1000 W Solar Simulator (Newspec Ltd) equipped with an AM 1.5 G filter (Newspec Ltd.). The light intensity is adjusted to 100 mW $cm^{-2}$ using a calibrated Si photodetector (PECSI01, Peccell Technologies, Inc.). A black paper mask with open area of 0.81 $cm^2$ is attached to the FTO glass facing the solar simulator. The current voltage curves are recorded using a source-measure unit (2400, Keithley Instruments), controlled by a home-made Labview program. The voltage is swept from 850 mV to −30 mV in 5 mV steps. The settling time is 40 ms between each measurement point. A graph showing the recorded current density for the variation in voltage is shown in FIG. 2.

The results in the table are averages of the data generated for each of the cells described above.

| | Sample | Jsc (mA·$cm^{-2}$) | Voc (mV) | FF | Efficiency (%) | Normalised efficiency |
|---|---|---|---|---|---|---|
| 1 | no ALD | 7.3 | 726 | 0.62 | 3.3 | 1.00 |
| 2 | 300 cycle ALD top coat | 8.5 | 733 | 0.60 | 3.7 | 1.12 |
| 3 | 500 cycle ALD top coat | 9.6 | 735 | 0.61 | 4.3 | 1.30 |

Efficiency increases by 12% (300 cycle) and 30% (500 cycle)

Example 3

Combination of ALD Underlayer and Topcoat

The Asahi FTO glass substrates (sheet resistance: 12 Ohm per square, effective transmittance>80%, haze: 10-20%, glass side thickness: 1.8 mm) are cut to 7 cm by 3 cm rectangles.

The substrates are then cryogenically cleaned on the conductive side with a liquid $CO_2$ spray.

An ALD underlayer of 1000 cycles of $TiO_2$ is applied at 120° C. to the conductive side of the substrate (sample #2). The two edges of the substrate that are not to be coated with paste are masked with pieces of soda glass attached with metal clips, in order to prevent coating of this area during the ALD process.

The thin film of titania is deposited onto sample #2 using a flow-type hot-walled F-120 ALD reactor from ASM Microchemistry. Substrates are positioned in the hot-zone of the vacuum chamber, in the centre of the gas flow, on a microscope glass slide for support. The chamber is continually flushed with nitrogen gas flowing at 350/200 sccm, and pressure is maintained at less than 1 mbar. Precursor vapour from titanium tetrachloride ($TiCl_4$) and water is delivered from Peltier cooled reservoirs maintained at 20° C. The pulsing sequence chosen is 0.5 seconds exposure to $TiCl_4$ followed by a 1.0 second nitrogen-only purge, then 1.0 seconds exposure to water followed by a 1.5 second nitrogen-only purge. Coating processes are completed at 120° C. and the thickness of the titania coating is controlled by the number of deposition cycles.

The low temperature titania paste from Peccell (product name PECC-C01-06) is doctor bladed twice onto the conductive side of the substrates using a clean glass pipette. The thickness of the layer is regulated by two layers of 3M Scotch Magic Tape (Catalogue No 810) applied along the first 5 mm of each long edge of the substrate. After application of the first doctor bladed layer, the paste is allowed to dry prior to application of the second layer.

After drying of the doctor bladed paste, an ALD coating of $TiO_2$ is applied (500 cycles) on top of the doctor bladed paste (sample #2). The two edges of the substrate that are not coated with paste are masked with pieces of soda glass attached with metal clips, in order to prevent coating during the ALD process. The control sample (sample #1) is heated within the ALD heating zone, but outside the reaction chamber, therefore resulting in the same thermal drying cycle as the ALD top coated sample. The experimental conditions are the same as described in Step 3.

The samples are heated to 120° C. for 3 hours prior to immersion in dye, then placed into the dye solution consisting of 0.3 mM N719 dye (cis-bis(isothiocyanato)bis(2,2'-bipyridyl-4,4'-dicarboxylato)-ruthenium(II) bis-tetrabutylammonium, Solaronix) and 0.15 mM chenodeoxycholic acid (Fluka) in acetonitrile (anhydrous, 99.8%, Sigma)/2-Methyl-2-propanol (99%, Alfa Aeasar) (1:1) (V:V). The substrates are kept in the dye solution for 1 day.

Two DSSCs with ALD, 1 DSSC without ALD are fabricated with an active area of ~0.6 $cm^2$. Sandwich-type photovoltaic devices are assembled using the dye sensitized $TiO_2$ films as photoanodes and sputtered Pt (8 nm) on ITO glass as counter electrodes. A 25 μm thick, U-shaped polymer film is used as a spacer between the photoanode and counter electrode. The sandwich type device is held together using foldback clips (SX 1170-25, Solaronix). The electrolyte consisting of 0.6 M 1-propyl-2,3-dimethylimidazolium iodide (DMPII, Solaronix), 0.03 M iodine (Suprapur, Merck), 0.1 M guanidium thiocyanate (for molecular biology, Sigma), 0.5 M 4-tert-butylpyridine (99%, Aldrich) dissolved in a 85:15 mixture by volume of acetonitrile (anhydrous, 99.8%, Sigma) and valeronitrile (99.5% Aldrich). The electrolyte is injected into the space between the $TiO_2$ photoanode and counter electrode, and the photovoltaic performance is tested using a 1000 W Solar Simulator (Newspec Ltd) equipped with an AM 1.5 G filter (Newspec Ltd.). The light intensity is adjusted to 100 mW $cm^{-2}$ using a calibrated Si photodetector (PECSI01, Peccell Technologies, Inc.). A black paper mask with open area of 0.81 $cm^2$ is attached to the FTO glass facing the solar simulator. The current voltage curves are recorded using a source-measure unit (2400, Keithley Instruments), controlled by a home-made Labview program. The voltage is swept from 850 mV to −30 mV in 5 mV steps. The settling time is 40 ms between each measurement point.

Results

The results in the table are averages of the data generated for each of the cells described above.

| | Sample | Jsc (mA·$cm^{-2}$) | Voc (mV) | FF | Efficiency (%) | Normalised efficiency |
|---|---|---|---|---|---|---|
| 1 | no ALD | 4.4 | 670 | 0.61 | 1.8 | 1.00 |
| 2 | ALD underlayer and topcoat | 5.0 | 780 | 0.64 | 2.5 | 1.39 |

The Jsc, Voc and energy conversion efficiency are increased for the cells with ALD top coat. Efficiency increases by 39%.

Further Examples are Provided to Highlight the Scope of the Invention

Example 4

ALD Topcoat on Low Temperature Paste

The effect of an ALD $TiO_2$ topcoat using $TiCl_4$ as the precursor deposited at 120° C. on a low temperature paste, on the photoanode in preparation for the assembly of a liquid DSSC is investigated.

The topcoat is applied at 120° C. using 50 alternating cycles of titanium tetrachloride ($TiCl_4$) and water ($H_2O$), followed by 20 additional water ($H_2O$) pulses.

| Sample | Jsc (mA · cm$^{-2}$) | Voc (mV) | FF | Efficiency (%) | Normalised efficiency |
|---|---|---|---|---|---|
| Control (non-ALD) | 7.36 | 700 | 0.67 | 3.5 | 1.00 |
| ALD top coat-50/20 cycles | 8.49 | 719 | 0.67 | 4.1 | 1.17 |

The Jsc, Voc and energy conversion efficiency are increased for the cells with ALD top coat. The resultant net gain in efficiency for the ALD top-coated cells is 17%.

Example 5

Effect of Time Lapse Before Dye Immersion

The effect of time lapse prior to dye immersion on an ALD topcoat on a low temperature paste is investigated. The topcoat is applied at 120° C. using 50 alternating cycles of titanium tetrachloride ($TiCl_4$) and water ($H_2O$), followed by 20 additional water ($H_2O$) pulses, in preparation for the assembly of a liquid DSSC.

Following ALD coating of the low temperature paste, samples are removed from the vacuum chamber and stored under ambient (room temperature) conditions for a period of 1 day. Before dye loading, the control and ALD coated samples are heated to 120° C. on a hotplate for 15 minutes and then placed in standard N719 dye solution for the standard period described above.

| Sample | Jsc (mA · cm$^{-2}$) | Voc (mV) | FF | Efficiency (%) | Normalised efficiency |
|---|---|---|---|---|---|
| Control (no ALD) | 8.24 | 727 | 0.59 | 3.5 | 1.00 |
| ALD top coat-50/20 cycles | 8.72 | 738 | 0.59 | 3.8 | 1.11 |

The Jsc, Voc and energy conversion efficiency is increased for the cells with ALD top coat. The resultant net gain in efficiency from for ALD topcoated cells is 11%.

Example 6

ALD Topcoat with Alternative Ruthenium Dye

The effect of an ALD $TiO_2$ topcoat using $TiCl_4$ as the precursor deposited at 120° C. on a low temperature paste on the photoanode using Z907 dye, cis-bis(isothiocyanato)(2,2'-bipyridyl-4,4'-dicarboxylato) (2,2'-bipyridyl-4,4'-di-nonyl)ruthenium(II) instead of N719 dye, in preparation for the assembly of a liquid DSSC is investigated. The topcoat is applied using 50 alternating cycles of titanium tetrachloride ($TiCl_4$) and water ($H_2O$), followed by 20 additional water ($H_2O$) pulses.

Both the control and ALD coated photoanodes are immersed in Z907 dye for a period of 1 day before DSSC assembly.

| Sample | Jsc (mA · cm$^{-2}$) | Voc (mV) | FF | Efficiency (%) | Normalised efficiency |
|---|---|---|---|---|---|
| Control (no ALD) | 6.42 | 727 | 0.66 | 3.1 | 1.00 |
| ALD top coat-50/20 cycles | 6.83 | 739 | 0.65 | 3.3 | 1.07 |

The Jsc, Voc and energy conversion efficiency are increased for the cells with ALD top coat. The resultant net gain in efficiency for ALD topcoated cells is 7%.

Example 7

ALD Topcoat with a Non-Ruthenium Dye

The effect of an ALD $TiO_2$ topcoat using $TiCl_4$ as the precursor deposited at 120° C. on a low temperature paste, on the photoanode with D149 indoline dye, 5-[[4-[4-(2,2-diphenylethenyl)phenyl]-1,2,3,3a,4,8b-hexahydrocyclopent[b]indol-7-yl]methylene]-2-(3-ethyl-4-oxo-2-thioxo-5-thiazolidinylidene)-4-oxo-3-thiazolidineacetic acid, 5-[[4-[4-(2,2-diphenylethenyl)phenyl]-1,2,3,3a,4,8b-hexahydrocyclopent[b]indol-7-yl]methylene]-2-(3-ethyl-4-oxo-2-thioxo-5-thiazolidinylidene)-4-oxo-3-thiazolidineacetic acid instead of N719 dye, in preparation for the assembly of a liquid DSSC is investigated. The topcoat is applied using 50 alternating cycles of titanium tetrachloride ($TiCl_4$) and water ($H_2O$), followed by 20 additional water ($H_2O$) pulses.

Both the control and ALD coated photoanodes are immersed in D149 dye for a period of 2 hours before DSSC assembly.

| Sample | Jsc (mA · cm$^{-2}$) | Voc (mV) | FF | Efficiency (%) | Normalised efficiency |
|---|---|---|---|---|---|
| Control (no ALD) | 8.9 | 665 | 0.61 | 3.6 | 1.00 |
| ALD top coat-50/20 cycles | 10.5 | 656 | 0.59 | 4.1 | 1.14 |

Both the Jsc and energy conversion efficiency are increased for the cells with ALD top coat. The resultant net gain in efficiency from ALD topcoated cells is 14%.

Example 8

Combination of ALD Niobium Oxide Underlayer and ALD Titanium Dioxide Topcoat

The effect of ALD deposition of an underlayer and topcoat, using a titania low temperature paste in preparation of a liquid DSSC is investigated. The underlayer is $Nb_2O_5$ formed using ($Nb(OC_2H_5)_5$) precursor at 200° C. and the topcoat is applied at 120° C. using 50 alternating cycles of titanium tetrachloride ($TiCl_4$) and water ($H_2O$), followed by 20 additional water ($H_2O$) pulses, in preparation for the assembly of a liquid DSSC.

| Sample | Jsc (mA·cm$^{-2}$) | Voc (mV) | FF | Efficiency (%) | Normalised efficiency |
|---|---|---|---|---|---|
| Control (no ALD) | 7.36 | 700 | 0.67 | 3.5 | 1.00 |
| ALD topcoat only - 50/20 cycles | 8.49 | 719 | 0.67 | 4.1 | 1.17 |
| ALD underlayer only - 400 cycles | 8.23 | 823 | 0.69 | 4.6 | 1.31 |
| ALD underlayer - 400 cycles and topcoat - 50/20 cycles | 8.66 | 818 | 0.69 | 4.9 | 1.40 |

The Jsc, Voc and energy conversion efficiency are increased for the cells with ALD top coat and/or underlayer. A combination of an underlayer and a topcoat on a $TiO_2$ semiconductor formed of a particulate metal oxide produces the highest gain in efficiency of 40%.

Example 9

ALD Topcoat on In-House Tin Oxide Photoanode

The effect of an ALD $TiO_2$ topcoat on an in-house paste prepared from $SnO_2$ on the photoanode in preparation for the assembly of a liquid DSSC is investigated. The topcoat is applied at 120° C. using 50 alternating cycles of titanium tetrachloride ($TiCl_4$) and water ($H_2O$), followed by 20 additional water ($H_2O$) pulses.

| Sample | Jsc (mA·cm$^{-2}$) | Voc (mV) | FF | Efficiency (%) | Normalised efficiency |
|---|---|---|---|---|---|
| Control (no ALD) | 6.88 | 287 | 0.26 | 0.52 | 1.00 |
| ALD topcoat only - 50/20 cycles | 7.21 | 323 | 0.25 | 0.58 | 1.11 |

In this case the increase in energy conversion efficiency is 11%. The Jsc and Voc are increased by the application of an ALD topcoat by 5% and 12% respectively Example 10

ALD Underlayer and Topcoat with Low Temperature Titanium Dioxide Photoanode on Polymer Substrate The effect of a combination of ALD underlayer and topcoat on a low temperature $TiO_2$ photoanode layer on a polymer substrate is investigated. The underlayer is applied at 120° C. using 25 alternating cycles of titanium tetrachloride ($TiCl_4$) and water ($H_2O$) and the topcoat is applied at 120° C. using 50 alternating cycles of titanium tetrachloride ($TiCl_4$) and water ($H_2O$), followed by 20 additional water ($H_2O$) pulses, in preparation for the assembly of a liquid DSSC.

The polymer substrates are $H_2O$ plasma treated before the application of the ALD underlayer. After application and drying of the $TiO_2$ photoanode, a further heat treatment is undertaken at 150° C. on a hotplate substrate for 15 minutes. The polymer substrate with coated photoanode is processed according to the DSSC assembly description. The counter electrode is Pt coated glass substrate. The spacer in the assembly of the photoanode and counter electrode is Solaronix spacer 60 µm (SX1170-60).

| Sample | Jsc (mA·cm$^{-2}$) | Voc (mV) | FF | Efficiency (%) | Normalised efficiency |
|---|---|---|---|---|---|
| Control | 5.66 | 871 | 0.57 | 2.82 | 1.00 |
| ALD underlayer - 25 cycles | | | | | |
| ALD underlayer - 25 cycles and topcoat - 50/20 cycles | 6.34 | 850 | 0.58 | 3.10 | 1.10 |

Both the Jsc and energy conversion efficiency is increased for the cells with ALD top coat. The resultant gain in efficiency for cells prepared with an ALD topcoat on a low temperature paste is 10%.

Example 11

ALD Topcoat Using Alternate Titanium Precursor

The effect of a 25 cycle ALD $TiO_2$ topcoat using (Ti(i-$OC_3H_7$)$_4$) as the precursor deposited at 250° C. on a high temperature paste on the photoanode in preparation of a liquid DSSCs is investigated.

| Sample | Jsc (mA·cm$^{-2}$) | Voc (mV) | FF | Efficiency (%) | Normalised efficiency |
|---|---|---|---|---|---|
| Control (no ALD) | 2.54 | 675 | 0.61 | 1.06 | 1.00 |
| ALD topcoat - 25 cycles | 5.01 | 764 | 0.65 | 2.50 | 2.36 |

The Jsc, Voc and energy conversion efficiency are increased for the cells with ALD top coat. The resultant gain in efficiency for the ALD topcoated cells is 136%.

Example 12

ALD Niobium Oxide Topcoat on High Temperature Paste

The effect of a 50 cycle ALD $Nb_2O_5$ topcoat using (Nb($OC_2H_5$)$_5$) as the precursor deposited at 300° C. on a high temperature paste on the photoanode in preparation for the assembly of a liquid DSSC is investigated.

| Sample | Jsc (mA·cm$^{-2}$) | Voc (mV) | FF | Efficiency (%) | Normalised efficiency |
|---|---|---|---|---|---|
| Control (no ALD) | 2.00 | 665 | 0.59 | 0.8 | 1.00 |
| ALD topcoat - 50 cycles | 2.67 | 670 | 0.60 | 1.1 | 1.38 |

Both the Jsc and energy conversion efficiency are increased for the cells with ALD top coat. The resultant gain in efficiency for the ALD top-coated cells is 38%.

Example 13

ALD Topcoat of Niobium Oxide on High Temperature Paste

The effect of an ALD $Nb_2O_5$ topcoat on a high temperature paste on the photoanode in preparation for the assembly of a liquid DSSC is investigated. The topcoat is applied at 250° C. using 50 alternating cycles of niobium ethoxide (Nb(OC$_2$H$_5$)$_5$) and water (H$_2$O).

| Sample | Jsc (mA·cm$^{-2}$) | Voc (mV) | FF | Efficiency (%) | Normalised efficiency |
|---|---|---|---|---|---|
| Control (no ALD) | 2.53 | 688 | 0.62 | 1.1 | 1.00 |
| ALD topcoat - 50 cycles | 4.26 | 715 | 0.63 | 1.9 | 1.72 |

The Jsc, Voc and energy conversion efficiency are increased for the cells with ALD top coat. The resultant gain in efficiency for cells prepared with an ALD topcoat on a high temperature paste is 72%.

Example 14

ALD Underlayer and Topcoat of Titanium Dioxide on High Temperature Paste with Ionic Liquid Electrolyte The effect of a combination of ALD underlayer and topcoat on a high temperature TiO$_2$ paste on a photoanode layer using ionic liquid electrolyte is investigated, in preparation for the assembly of an ionic liquid DSSC. The underlayer is applied at 300° C. using 400 alternating cycles of titanium tetrachloride (TiCl$_4$) and water (H$_2$O) and the topcoat is applied at 120° C. using 50 alternating cycles of titanium tetrachloride (TiCl$_4$) and water (H$_2$O), followed by 20 additional water (H$_2$O) pulses.

| Sample | Jsc (mA·cm$^{-2}$) | Voc (mV) | FF | Efficiency (%) | Normalised efficiency |
|---|---|---|---|---|---|
| Control | 1.95 | 638 | 0.62 | 0.77 | 1.00 |
| ALD underlayer - 400 cycles | | | | | |
| ALD underlayer - 400 cycles and topcoat - 50/20 cycles | 1.73 | 680 | 0.73 | 0.86 | 1.12 |

Both the Voc and energy conversion efficiency are increased for the cells with ALD top coat. The resultant gain in efficiency for cells prepared with an ALD underlayer and topcoat on a high temperature paste with ionic liquid electrolyte is 12%.

Example 15

ALD Underlayer and Topcoat of Titanium Dioxide on High Temperature Paste with Hole Transport Material The effect of an ALD deposition on dual layered DSCC architecture using a high temperature paste where an underlayer and topcoat are applied in preparation of a solid state DSSC is investigated. The TiO$_2$ underlayer is applied at 300° C. using 400 alternating cycles of titanium tetrachloride (TiCl$_4$) and water (H$_2$O) and the topcoat is applied at 120° C. using 50 alternating cycles of titanium tetrachloride (TiCl$_4$) and water (H$_2$O), followed by 20 additional water (H$_2$O) pulses. The counter electrode is gold and is deposited by evaporation.

| Sample | Jsc (mA·cm$^{-2}$) | Voc (mV) | FF | Efficiency (%) | Normalised efficiency |
|---|---|---|---|---|---|
| Control | 0.22 | 601 | 0.54 | 0.07 | 1.00 |
| ALD underlayer - 400 cycles | | | | | |
| ALD underlayer - 400 cycles and topcoat - 50/20 cycles | 0.44 | 567 | 0.51 | 0.14 | 2.00 |

Both the Jsc and energy conversion efficiency are increased for the cells with ALD top coat. The resultant gain in efficiency from cells prepared with an ALD underlayer and topcoat on a high temperature paste with solid electrolyte is 100%.

Example 16

Spray Pyrolysis Titanium Dioxide Underlayer and ALD Topcoat of Titanium Dioxide on High Temperature Paste with Hole Transport Material The effect of a spray pyrolysis underlayer of TiO$_2$ and an ALD TiO$_2$ topcoat using a high temperature paste in a solid state DSSC is investigated. The TiO$_2$ underlayer is formed using [Ti(acac)$_2$(i-C$_3$H$_7$O)$_2$] precursor and deposited at 450° C. The TiO$_2$ topcoat is formed using titanium tetrachloride (TiCl$_4$) precursor deposited at 120° C. using 50 alternating cycles of titanium tetrachloride (TiCl$_4$) and water (H$_2$O), followed by 20 additional water (H$_2$O) pulses.

| Sample | Jsc (mA·cm$^{-2}$) | Voc (mV) | FF | Efficiency (%) | Normalised efficiency |
|---|---|---|---|---|---|
| Control Spray pyrolysis underlayer | 0.34 | 420 | 0.42 | 0.06 | 1.00 |
| Spray pyrolysis underlayer and ALD topcoat - 50/20 cycles | 0.42 | 587 | 0.56 | 0.14 | 2.33 |

The Jsc, Voc and energy conversion efficiency are increased for the cells with ALD top coat. The resultant gain in efficiency from cells prepared with a spray pyrolysis underlayer and an ALD topcoat on a high temperature paste with solid state hole transport material electrolyte is 133%.

The invention claimed is:

1. A dye sensitized solar cell (DSSC) having a semiconductor comprising a layer of particulate metal oxide and a dye adsorbed onto the semiconductor wherein the semiconductor interface with the dye is formed by atomic layer deposition (ALD) of a semiconductor material onto the particulate metal oxide, wherein the metal of the particulate metal oxide is selected from the group consisting of metals of Mg, Ca, Sr, Ba, Sc, Y, La, Ti, Hf, V, Nb, Ta, Cr, Mo, W, Fe, Ni, Cu, In, Al and Ga.

2. A DSSC according to claim 1, wherein the particulate metal oxide comprises at least one or more of titanium oxide, niobium oxide, tungsten oxide, indium oxide, tin oxide, nickel oxide, strontium titanate and zirconium oxide.

3. A DSSC according to claim 1 comprising a transparent substrate having an internal face; an optical electrode on the internal face of the substrate; a semiconductor comprising a layer of metal oxide particles; and a dye adsorbed onto the semiconductor wherein layers of semiconductor material formed by atomic layer deposition (ALD) provide an interface between each of the metal oxide particles and optical electrode and the metal oxide particles and the dye.

4. A DSSC according to claim 3 wherein the ALD layer between the metal oxide particles and the optical electrode is formed of a metal oxide selected from the group consisting of titanium oxide, niobium oxide, tungsten oxide, indium oxide, tin oxide, nickel oxide, zirconium oxide and zinc oxide.

5. A DSSC according to claim 1 comprising an optical electrode of a transparent conducting oxide (TCO) and a flexible light transmissible polymeric material on which the TCO is supported and wherein the atomic layer deposition is carried out at a temperature of no more than 150° C.

6. A DSSC according to claim 3 wherein the optical electrode is a transparent conducting oxide selected from fluorine doped tin oxide (FTO) and indium doped tin oxide (ITO).

7. A DSSC according to claim 1 wherein the particulate metal oxide comprises particles of size in the range of from 5 to 400 nm.

8. A DSSC according to claim 1 wherein the dye is selected from the group consisting of anthocyanins, squarates, eosins, xanthines, cyanines, merocyanines, phthalocyanines, indolines, porphyrins, oligothiophenes, coumarins, perylenes, pyrroles, and a metal complex that includes a metal atom or multivalent metal ion.

9. A DSSC according to claim 1 wherein the dye comprises at least one selected from the group consisting of cis-bis(isothiocyanato)bis(2,2'-bipyridyl-4,4'-dicarboxylato)-ruthenium (II) ("N3 dye"); tris(isothiocyanato)-ruthenium (II)-2,2':6',2"-terpyridine-4,4',4"-tricarboxylic acid; cis-bis(isothiocyanato)bis(2,2'-bipyridyl-4,4'-dicarboxylato) ruthenium (II) bis-tetrabutylammonium; cis-bis(isocyanato)(2,2'-bipyridyl-4,4'dicarboxylato)ruthenium (II); and tris(2,2'-bipyridyl-4,4'-dicarboxylato)ruthenium (II)dichloride.

10. A DSSC according to claim 1 comprising a electrolyte layer in the form of a liquid, gel, salt or solid electrolytes or n-type and p-type transporting materials.

11. A DSSC according to claim 10 where the electrolyte is iodide/iodine in a solvent.

12. A process for forming a DSSC comprising:
(i) forming a semiconductor layer of metal oxide particles selected from the group consisting of oxides of the metals Mg, Ca, Sr, Ba, Sc, Y, La, Ti, Hf, V, Nb, Ta, Cr, Mo, W, Fe, Ni, Cu, In, Al and Ga;
(ii) applying a semiconductor layer to the particles by a process comprising atomic layer deposition (ALD); and
(iii) adsorbing a photosensitive dye onto the ALD coated semiconductor layer of metal oxide particles.

13. A process according to claim 12 further comprising:
forming an optical electrode on a light transmissible substrate;
forming an ALD deposited layer of a metal oxide semiconductor on the optical electrode; and
forming the layer of metal oxide particles on said ALD deposited layer.

14. A process according to claim 12 wherein the DSSC comprises a light transmissible substrate which is a polymeric material and ALD is conducted at a temperature of no more than 150° C.

15. A DSSC according to claim 5 wherein the optical electrode is a transparent conducting oxide selected from fluorine doped tin oxide (FTO) and indium doped tin oxide (ITO).

16. A process according to claim 13 wherein the DSSC comprises a light transmissible substrate which is a polymeric material and ALD is conducted at a temperature of no more than 150° C.

17. A process according to claim 12, wherein the layer of metal oxide particles comprises at least one or more of titanium oxide, niobium oxide, tungsten oxide, indium oxide, tin oxide, nickel oxide, strontium titanate and zirconium oxide and the ALD layer of semiconductor is formed of one or more selected from the group consisting of titanium oxide, niobium oxide, tungsten oxide, indium oxide, tin oxide, nickel oxide and zinc oxide.

18. A process according to claim 12 wherein the dye is selected from the group consisting of anthocyanins, squarates, eosins, xanthines, cyanines, merocyanines, phthalocyanines, indolines, porphyrins, oligothiophenes, coumarins, perylenes, pyrroles, and a metal complex that includes a metal atom or multivalent metal ion.

19. A process for forming a DSSC according to claim 12 further comprising providing an electrolyte and counter electrode in operational relationship with said dye.

20. A DSSC according to claim 1, wherein the dye comprises a ruthenium transition metal complex, an osmium transition metal complex, or an iron transition metal complex.

21. A process according to claim 12, wherein the dye comprises a ruthenium transition metal complex, an osmium transition metal complex, or an iron transition metal complex.

22. A DSSC according to claim 1 wherein the dye comprises cis-bis(isothiocyanato)(2,2'-bipyridyl-4,4'-dicarboxylato) (2,2'-bipyridyl-4,4'-di-nonyl)ruthenium(II) ("Z907 dye"); 5-[[4-[4-(2,2-diphenylethenyl)phenyl]-1,2,3,3a,4,8b-hexahydrocyclopent[b]-indol-7-yl]methylene]-2-(3-ethyl-4-oxo-2-thioxo-5-thiazolidinylidene)-4-oxo-3-thiazolidineacetic acid; or 5-[[4-[4-(2,2-diphenylethenyl)phenyl]-1,2,3,3a,4,8b-hexahydrocyclopent[b]-indol-7-yl]methylene]-2-(3-ethyl-4-oxo-2-thioxo-5-thiazolidinylidene)-4-oxo-3-thiazolidineacetic acid ("D149 indoline dye").

23. A process according to claim 12 wherein the dye comprises cis-bis(isothiocyanato)(2,2'-bipyridyl-4,4'-dicarboxylato) (2,2'-bipyridyl-4,4'-di-nonyl)ruthenium(II) ("Z907 dye"); 5-[[4-[4-(2,2-diphenylethenyl)phenyl]-1,2,3,3a,4,8b-hexahydrocyclopent[b]-indol-7-yl]methylene]-2-(3-ethyl-4-oxo-2-thioxo-5-thiazolidinylidene)-4-oxo-3-thiazolidineacetic acid; or 5-[[4-[4-(2,2-diphenylethenyl)phenyl]-1,2,3,3a,4,8b-hexahydrocyclopent[b]-indol-7-yl]methylene]-2-(3-ethyl-4-oxo-2-thioxo-5-thiazolidinylidene)-4-oxo-3-thiazolidineacetic acid ("D149 indoline dye").

* * * * *